United States Patent
Tang et al.

(10) Patent No.: US 11,487,374 B2
(45) Date of Patent: Nov. 1, 2022

(54) DISPLAY SUBSTRATE AND METHOD FOR MANUFACTURING THE SAME, AND DISPLAY APPARATUS

(71) Applicants: MIANYANG BOE OPTOELECTRONICS TECHNOLOGY CO., LTD., Sichuan (CN); BOE TECHNOLOGY GROUP CO., LTD., Beijing (CN)

(72) Inventors: Yao Tang, Beijing (CN); Shihpo Chou, Beijing (CN)

(73) Assignees: MIANYANG BOE OPTOELECTRONICS TECHNOLOGY CO., LTD., Sichuan (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 53 days.

(21) Appl. No.: 17/055,458

(22) PCT Filed: Mar. 6, 2020

(86) PCT No.: PCT/CN2020/078096
§ 371 (c)(1),
(2) Date: Nov. 13, 2020

(87) PCT Pub. No.: WO2020/187055
PCT Pub. Date: Sep. 24, 2020

(65) Prior Publication Data
US 2021/0181880 A1 Jun. 17, 2021

(30) Foreign Application Priority Data
Mar. 21, 2019 (CN) .......................... 201910218357.X

(51) Int. Cl.
*G06F 3/041* (2006.01)
*G06F 3/044* (2006.01)
(Continued)

(52) U.S. Cl.
CPC .......... *G06F 3/0412* (2013.01); *G03F 7/0002* (2013.01); *G03F 7/0007* (2013.01);
(Continued)

(58) Field of Classification Search
CPC .... G06F 3/0412; G06F 3/0446; G06F 3/0443; G03F 7/0002; G03F 7/0007;
(Continued)

(56) References Cited

U.S. PATENT DOCUMENTS

2011/0058150 A1* 3/2011 Schaper ................. G03B 27/42
355/53
2017/0168608 A1* 6/2017 Kim ....................... G06F 3/0445
(Continued)

FOREIGN PATENT DOCUMENTS

| CN | 106405920 A | 2/2017 |
|---|---|---|
| CN | 106873817 A | 6/2017 |

(Continued)

OTHER PUBLICATIONS

Office action dated Aug. 4, 2020 in counterpart CN Patent Application No. 201910218357.X, 15 pages.
(Continued)

*Primary Examiner* — Prabodh M Dharia
(74) *Attorney, Agent, or Firm* — Procopio, Cory, Hargreaves & Savitch LLP

(57) ABSTRACT

A method for manufacturing a display substrate includes: providing a base, the base having a non-display area that includes a binding area; forming a light-emitting functional layer and an encapsulating layer successively on a side of the base, an orthographic projection of the encapsulating layer
(Continued)

on the base not overlapping with the binding area; and forming a touch structure on a surface of encapsulating layer away from the base, the touch structure including a first part that is in contact with the encapsulating layer, and a material of the first part including a conductive material. Forming the first part includes: forming the first part by a nanoimprint process.

11 Claims, 13 Drawing Sheets

(51) Int. Cl.
  *G03F 7/00* (2006.01)
  *H01L 27/32* (2006.01)
  *H01L 51/52* (2006.01)
  *H01L 51/56* (2006.01)

(52) U.S. Cl.
  CPC .......... *G06F 3/0443* (2019.05); *G06F 3/0446* (2019.05); *H01L 27/323* (2013.01); *H01L 27/3244* (2013.01); *H01L 51/5253* (2013.01); *H01L 51/56* (2013.01); *G06F 2203/04103* (2013.01); *G06F 2203/04111* (2013.01); *H01L 2227/323* (2013.01)

(58) Field of Classification Search
  CPC ............... H01L 27/3244; H01L 27/323; H01L 51/5253; H01L 51/56
  USPC ............................................ 345/174; 355/53
  See application file for complete search history.

(56) References Cited

U.S. PATENT DOCUMENTS

| | | |
|---|---|---|
| 2019/0018526 A1* | 1/2019 | Fu ................... H01L 27/124 |
| 2019/0073071 A1 | 3/2019 | Ryu et al. |
| 2019/0181381 A1* | 6/2019 | Sun .................. H01L 27/32 |
| 2019/0267572 A1* | 8/2019 | Wang .............. H01L 27/3276 |

FOREIGN PATENT DOCUMENTS

| | | |
|---|---|---|
| CN | 108920012 A | 11/2018 |
| CN | 109920828 A | 6/2019 |
| KR | 20170042090 A | 4/2017 |

OTHER PUBLICATIONS

Office action dated Mar. 22, 2021 in counterpart CN Patent Application No. 201910218357.X, 11 pages.

\* cited by examiner

DISPLAY SUBSTRATE AND METHOD FOR MANUFACTURING THE SAME, AND DISPLAY APPARATUS

CROSS-REFERENCE TO RELATED APPLICATIONS

This application is a national phase entry under 35 USC 371 of International Patent Application No. PCT/CN2020/078096 filed on Mar. 6, 2020, which claims priority to Chinese Patent Application No. 201910218357.X, filed on Mar. 21, 2019, titled "OLED SUBSTRATE AND MANUFACTURING METHOD THEREOF", which are incorporated herein by reference in their entirety.

TECHNICAL FIELD

The present disclosure relates to the field of display technologies, and more particularly, to a display substrate and a method for manufacturing the same, and a display apparatus.

BACKGROUND

With development of economy and life, touch display panels have been widely accepted and used by people. Herein, the touch display panel refers to a panel that combines a touch structure and a display panel, so that the display panel combined with the touch structure has both display and touch sensing functions. For example, smart phones, tablets, etc. all use touch display panels. Among them, an organic light emitting diode (OLED) display screen or quantum light-emitting diode (QLED) display screen integrated with the touch structure has become a hot spot for high-end smart products.

SUMMARY

In an aspect, a method for manufacturing a display substrate is provided. The method includes: providing a base, the base having a non-display area that includes a binding area; forming a light-emitting functional layer and an encapsulating layer successively on a side of the base, an orthographic projection of the encapsulating layer on the base not overlapping with the binding area; and forming a touch structure on a surface of the encapsulating layer away from the base, the touch structure including a first part that is in contact with the encapsulating layer, and a material of the first part including a conductive material. Forming the first part includes: forming the first part by a nanoimprint process.

In some embodiments, forming the touch structure on the surface of the encapsulating layer away from the base includes: forming a plurality of metal bridges that are spaced apart on the surface of the encapsulating layer away from the base, the plurality of metal bridges that are spaced apart being the first part of the touch structure; forming a plurality of first touch electrodes extending along a first direction on sides of the plurality of metal bridges away from the base, each first touch electrodes including a plurality of first touch sub-electrodes connected in series along the first direction; and forming a plurality of rows of second touch sub-electrodes in a same layer as the plurality of first touch electrodes, each row of second touch sub-electrodes including a plurality of second touch sub-electrodes that are spaced apart along a second direction, and every two adjacent second touch sub-electrodes in each row of second touch sub-electrodes being electrically connected with a single metal bridge through a via, so that the plurality of rows of second touch sub-electrodes and the plurality of metal bridges form the plurality of second touch electrodes. The first direction intersects the second direction.

In some embodiments, the method further includes: after forming the plurality of metal bridges, and before forming the plurality of first touch electrodes and the plurality of rows of second touch sub-electrodes in the same layer, forming a first insulating film on sides of the plurality of metal bridges away from the base; and patterning the first insulating film to form a plurality of vias exposing the plurality of metal bridges in the first insulating film.

In some embodiments, the plurality of first touch sub-electrodes and the plurality of rows of second touch sub-electrodes are both in a grid structure, and materials of the plurality of first touch sub-electrodes and the plurality of rows of second touch sub-electrodes are all metal materials.

In some embodiments, forming the touch structure on the surface of encapsulating layer away from the base includes: forming a plurality of second touch electrodes that are spaced apart along a second direction on the surface of the encapsulating layer away from the base, the plurality of second touch electrodes being the first part of the touch structure; forming a second insulating layer on sides of the plurality of second touch electrodes away from the base; and forming a plurality of first touch electrodes that are spaced apart and extend along a first direction on a side of the second insulating layer away from the base. The first direction intersects the second direction.

In some embodiments, forming the plurality of first touch electrodes includes: forming the plurality of first touch electrodes by a nanoimprint process.

In some embodiments, the plurality of first touch electrodes and the plurality of second touch electrodes are both in a grid structure, and materials of the plurality of first touch electrodes and the plurality of the second touch electrodes are all metal oxide materials.

In some embodiments, forming the first part by the nanoimprint process includes: providing a transfer printing template substrate; forming an imprint adhesive layer on a side of the transfer printing template substrate to obtain a transfer template, the imprint adhesive layer including a plurality of grooves that are spaced apart; filling the plurality of grooves with the conductive material; and imprinting the transfer printing template filled with the conductive material on the surface of the encapsulating layer away from the base to obtain the first part.

In some embodiments, forming the encapsulating layer on the side of the base includes: forming an anode layer on the side of the base; forming a light-emitting layer on a side of the anode layer away from the base; and forming a cathode layer on a side of the light-emitting layer away from the base.

In another aspect, a display substrate is provided. The display substrate includes: a base; a light-emitting functional layer and an encapsulating layer that are stacked successively on a side of the base; and a touch structure provided on a surface of the encapsulating layer away from the base. The base has a non-display area that includes a binding area. An orthographic projection of the encapsulating layer on the base does not overlap with the binding area. The touch structure includes a first part that is in contact with the encapsulating layer, and a material of the first part includes a conductive material.

In some embodiments, the first part includes a plurality of metal bridges that are spaced apart, and the touch structure further includes: a plurality of first touch electrodes extending along a first direction and a plurality of rows of second touch sub-electrodes. Each first touch electrode includes a plurality of first touch sub-electrodes connected in series. Each row of second touch sub-electrodes includes a plurality of second touch sub-electrodes that are spaced apart along a second direction. Every two adjacent second touch sub-electrodes in each row of second touch sub-electrodes are electrically connected with a single metal bridge through a via, so that the plurality of rows of second touch sub-electrodes and the plurality of metal bridges form the plurality of second touch electrodes. The plurality of first touch sub-electrodes and the plurality of rows of second touch sub-electrodes are of a same material, and the plurality of first touch electrodes and the plurality of rows of second touch electrodes are disposed in a same layer.

In some embodiments, the plurality of first touch sub-electrodes and the plurality of rows of second touch sub-electrodes are both in a grid structure, and materials of the plurality of first touch sub-electrodes and the plurality of rows of second touch sub-electrodes are all metal materials.

In some embodiments, the first part includes a plurality of second touch electrodes that are spaced apart and extend along a second direction. The touch structure further includes: a second insulating layer provided on sides of the plurality of second touch electrodes away from the base, and a plurality of first touch electrodes that are spaced apart and extend along a first direction provided on a side of the second insulating layer away from the base. The first direction intersects the second direction.

In some embodiments, the plurality of first touch sub-electrodes and the plurality of rows of second touch sub-electrodes are both in a grid structure, and materials of the plurality of first touch sub-electrodes and the plurality of rows of second touch sub-electrodes are all metal oxide materials.

In some embodiments, the display substrate further includes a protective layer provided on a side of the touch structure away from the base.

In some embodiments, the display substrate further includes a light-emitting functional layer provided between the base and the encapsulating layer. The light-emitting functional layer includes: an anode layer provided on a side of the base; a light-emitting layer provided on a side of the anode layer away from the base; and a cathode layer provided on a side of the light-emitting layer away from the base.

In some embodiments, the display substrate further includes: a plurality of signal lines electrically connected with the touch structure, the plurality of signal lines extending to the binding area.

In some embodiments, the plurality of signal lines and the first part of the touch structure are of a same material, and the plurality of signal lines and the first part are disposed in a same layer.

In yet another aspect, a display apparatus is provided. The display apparatus includes the display substrate as described in some of the above embodiments.

BRIEF DESCRIPTION OF THE DRAWINGS

In order to describe technical solutions in the present disclosure or the related art more clearly, the accompanying drawings to be used in the description of some embodiments or the related art will be introduced briefly. Obviously, the accompanying drawings to be described below are merely some embodiments of the present disclosure, and a person of ordinary skill in the art can obtain other drawings according to these drawings without paying any creative effort. In addition, the accompanying drawings in the following description may be regarded as schematic diagrams, and are not limitations on actual sizes of products and actual processes of methods that the embodiments of the present disclosure relate to.

DETAILED DESCRIPTION

Technical solutions in some embodiments of the present disclosure will be described clearly and completely below in combination with accompanying drawings. Obviously, the described embodiments are merely some but not all embodiments of the present disclosure. All other embodiments made on the basis of the embodiments of the present disclosure by a person of ordinary skill in the art without paying any creative effort shall be included in the protection scope of the present disclosure.

Unless the context requires otherwise, throughout the description and claims, the term "comprise/include" and other forms thereof such as the third-person singular form "comprises/includes" and the present participle form "comprising/including" are construed as an open and inclusive meaning, i.e., "include, but not limited to". In the description, the terms such as "one embodiment", "some embodiments", "exemplary embodiments", "example" or "some examples" and the like are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, specific features, structures, materials or characteristics may be included in any one or more embodiments or examples in any suitable manner.

Hereinafter, the terms such as "first" and "second" are used for descriptive purposes only, and are not to be construed as indicating or implying a relative importance or implicitly indicating the number of indicated technical features. Thus, features defined with "first" and "second" may explicitly or implicitly include one or more of the features. In the description of the embodiments of the present disclosure, the term "a plurality of/the plurality of" means two or more unless otherwise specified.

In the related art, in the process of fabricating a touch display panel, the touch structure is usually made separately, and then adhered to a display panel. However, with this approach, it is easy to make a thickness of the touch display panel larger, which is not conducive to making the touch display panel light and thin.

Based on this, in the related art, the touch structure is directly formed on an encapsulating layer of a display substrate in the display panel, and details are as follows.

Figure 1:
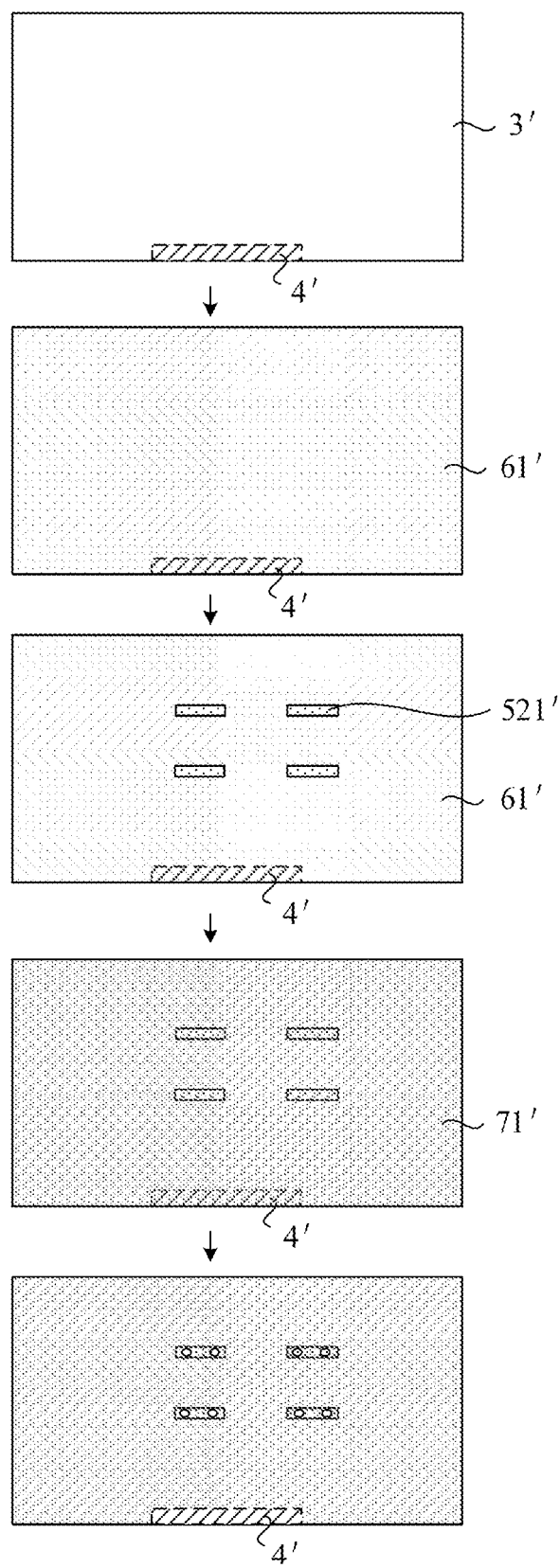
FIG. 1 is a flowchart of manufacturing a display substrate, according to the related art.
Figure 2:
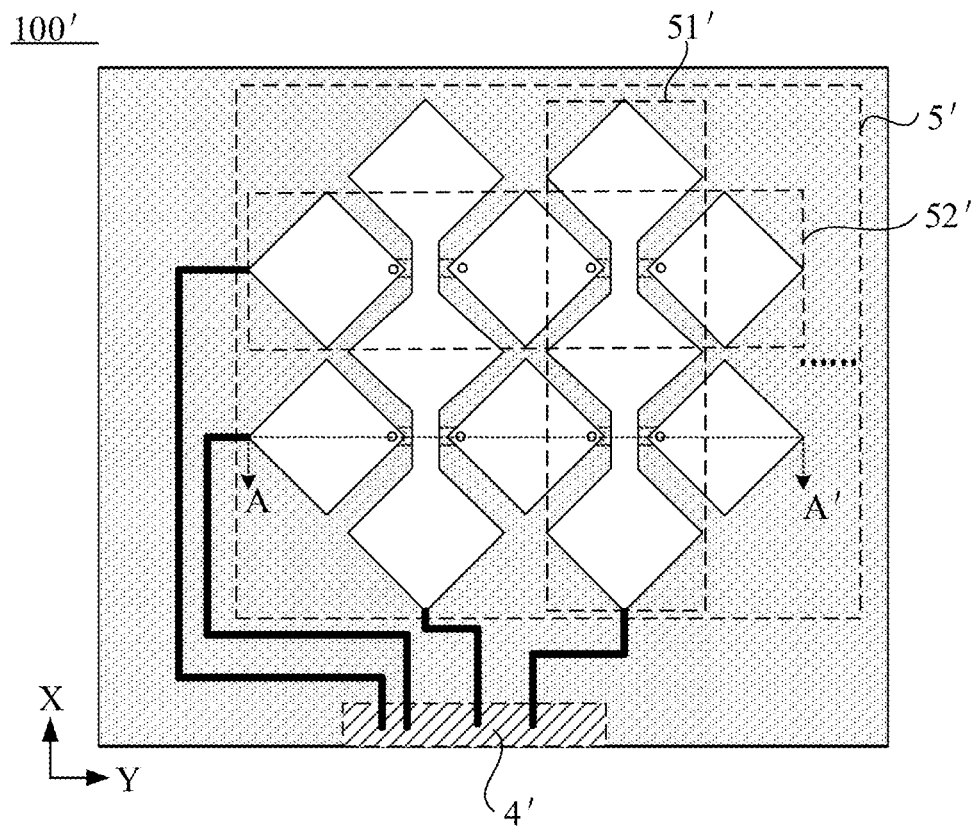
FIG. 2 is a top view of a display substrate, according to the related art.

As shown in FIGS. 1 and 2, the display substrate 100' has a binding area 4', and an encapsulating layer 3' exposes the binding area 4'. That is the encapsulating layer 3' does not cover the binding area 4'. A barrier film 61' (the barrier film 61' covers the binding area 4') is usually formed on the encapsulating layer 3' using an inorganic material (such as silicon nitride, SiNx) before a touch structure 5' is fabricated on the encapsulating layer 3', and then the touch structure 5' is formed on a side of the barrier film 61' away from the encapsulating layer 3', so that a plurality of welding points in the binding area 4' can be protected by the barrier film 61' during a formation of the touch structure 5'. In this way, it is possible to avoid damage to the plurality of welding points and avoid a short connection between the touch structure 5' and the plurality of welding points.

Figure 3:
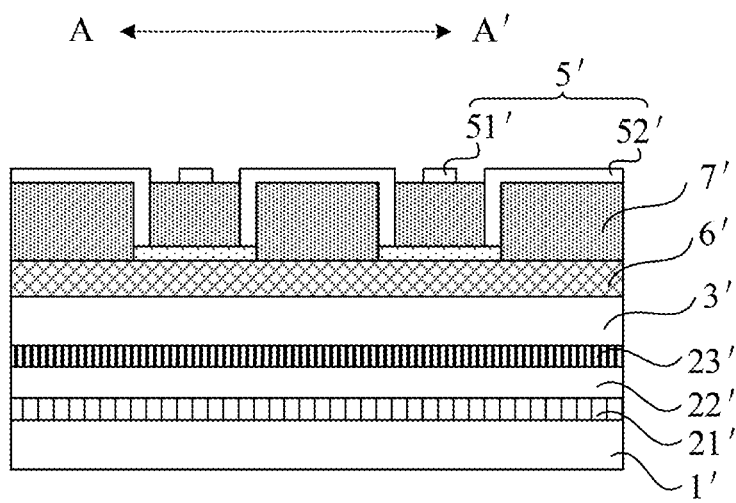
FIG. 3 is a cross-sectional view of the display substrate in FIG. 2 taken along line A-A'.

After the formation of the touch structure 5' or during the formation of the touch structure 5', a part of the barrier film 61' that covers the binding area 4' will be etched away to form a barrier layer 6' as shown in FIG. 3, so that the touch structure 5' can be electrically connected with the plurality of welding points in the binding area 4' through signal lines.

Here, the method is described by taking an example in which the barrier layer 6' is formed during the formation of the touch structure 5'. As shown in FIG. 1, after the barrier film 61' is formed, a plurality of bridges 521' are formed on a side of the barrier film 61'; then an insulating film 71' is formed on a side of the plurality of bridges 521', and both the barrier film 61' and the insulating film 71' are etched simultaneously to form the barrier layer 6' and the insulation layer 7' as shown in FIG. 3 and expose the binding area 4'. Meanwhile, the insulating layer 7' exposes surfaces of the plurality of bridges 521', so that after a first touch electrode 51' and a plurality of second touch sub-electrodes as shown in FIG. 2 are formed on a side of the insulating layer 7', the plurality of touch sub-electrodes can be electrically connected with the plurality of bridges 521' through vias to form a plurality of second touch electrodes 52'.

However, in the display substrate 100' fabricated by the above method, as shown in FIG. 3, a thickness of the display substrate 100' is easily increased due to a provision of the barrier layer 6', and since the barrier layer 6' is made of an inorganic material, a film stress in the display substrate 100' may be easily increased. Therefore, it is not conducive to making touch display panels thinner and more flexible in a case where the display substrate 100' is applied to a touch display panel.

Figure 4:
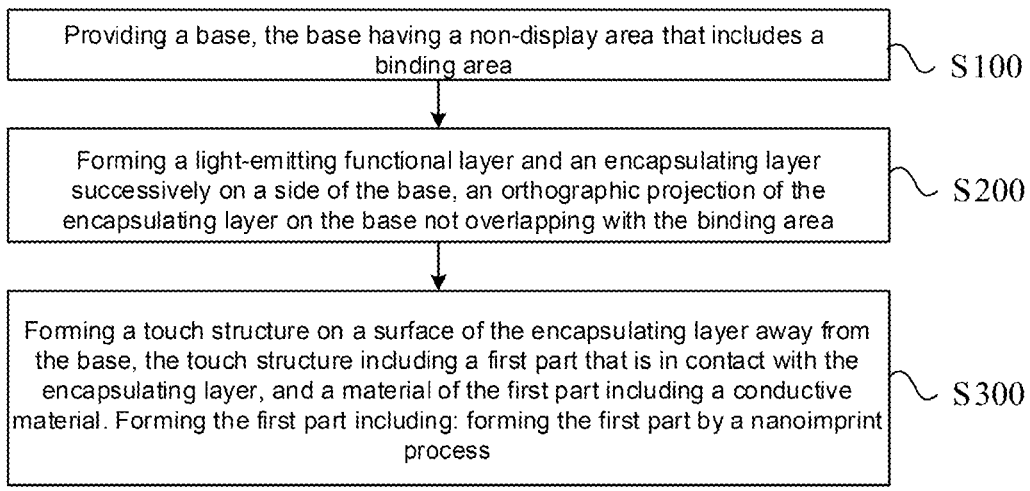
FIG. 4 is a flowchart of a method for manufacturing a display substrate, according to some embodiments of the present disclosure.

On this basis, some embodiments of the present disclosure provide a method for manufacturing a display substrate. As shown in FIG. 4, the method for manufacturing the display substrate includes the steps of S100 to S300.

Figure 10:
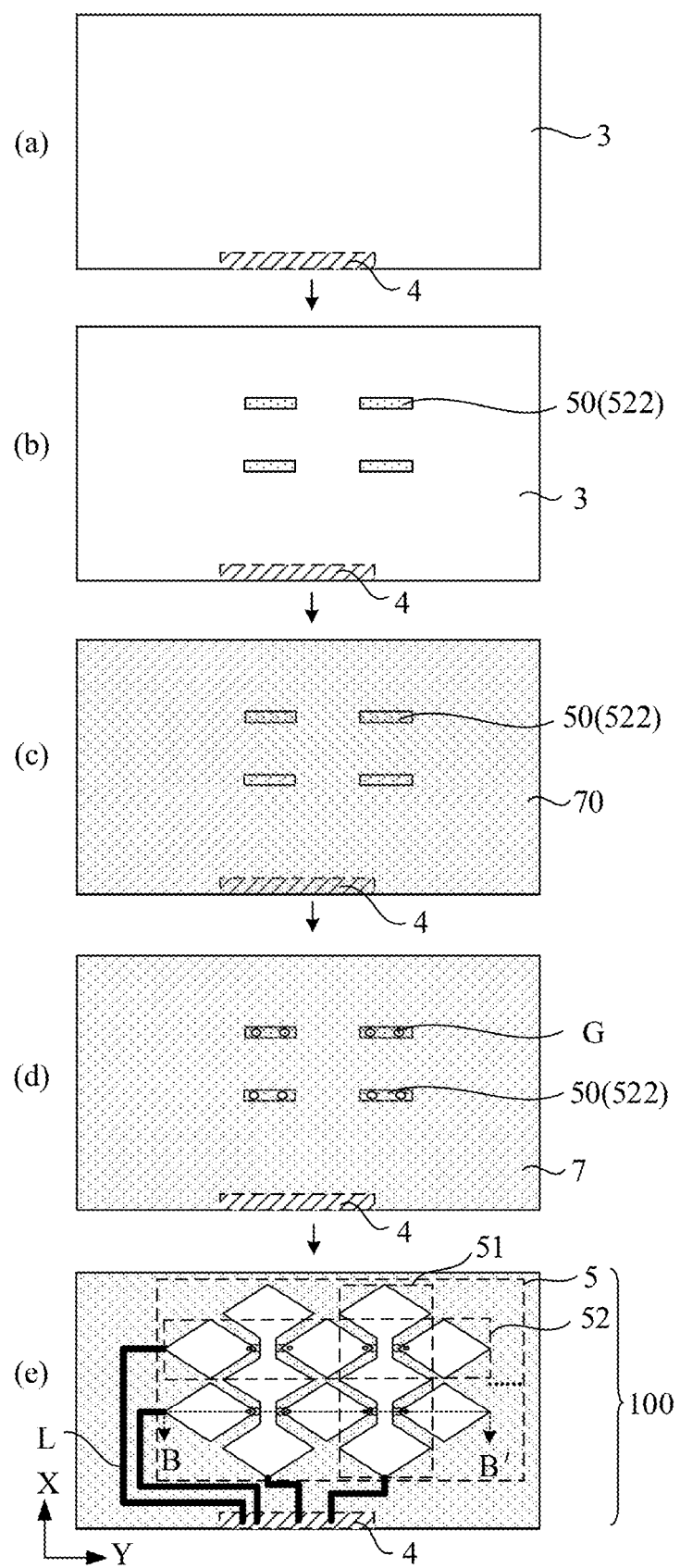
FIG. 10 is a flowchart of manufacturing a display substrate, according to some embodiments of the present disclosure.
Figure 21:
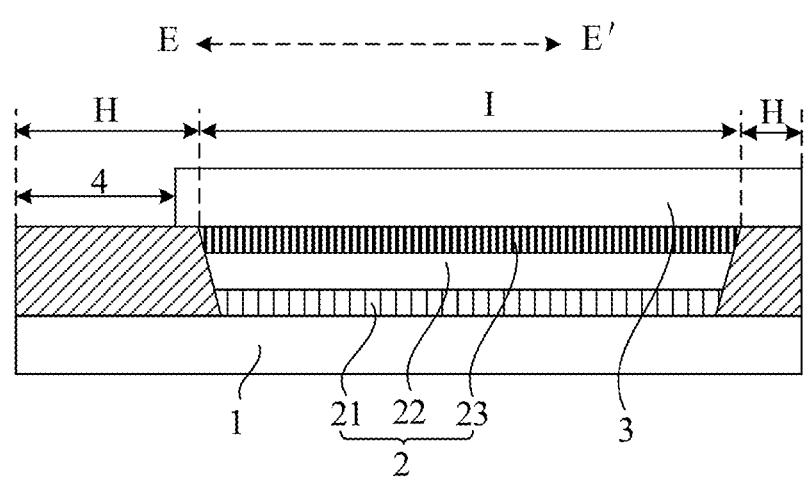
FIG. 21 is a cross-sectional view of the display substrate shown in FIG. 20 taken along line E-E'.

In S100, a base 1 is provided. As shown in FIGS. 10 and 21, the base 1 has a non-display area H, and the non-display area H includes a binding area 4.

In some examples, the base 1 includes a base substrate and a drive circuit provided on the base substrate. The drive circuit is configured to provide a drive voltage for the formed display substrate 100, so that the display substrate 100 can perform a display function.

The drive circuit is composed of a plurality of thin film transistors and at least one storage capacitor. The plurality of thin film transistors include a driving transistor and at least one switching transistor.

In some examples, the driving circuit includes a plurality of structures, for example, "6T1C", "7T1C", "6T2C", "7T2C", etc. Herein, "T" represents a thin film transistor, and the number before the "T" represents the number of the thin film transistors; "C" represents a storage capacitor, and the number before "C" represents the number of the storage capacitors.

In some examples, the base 1 is a flexible base, and the base substrate is a flexible base substrate. For example, the flexible base substrate is a polyethylene terephthalate (PET) base substrate, a polyethylene naphthalate two formic acid glycol ester (PEN) base substrate, or a polyimide (PI) base substrate.

In some examples, the non-display area H is located at an edge of the base 1.

Figure 11:
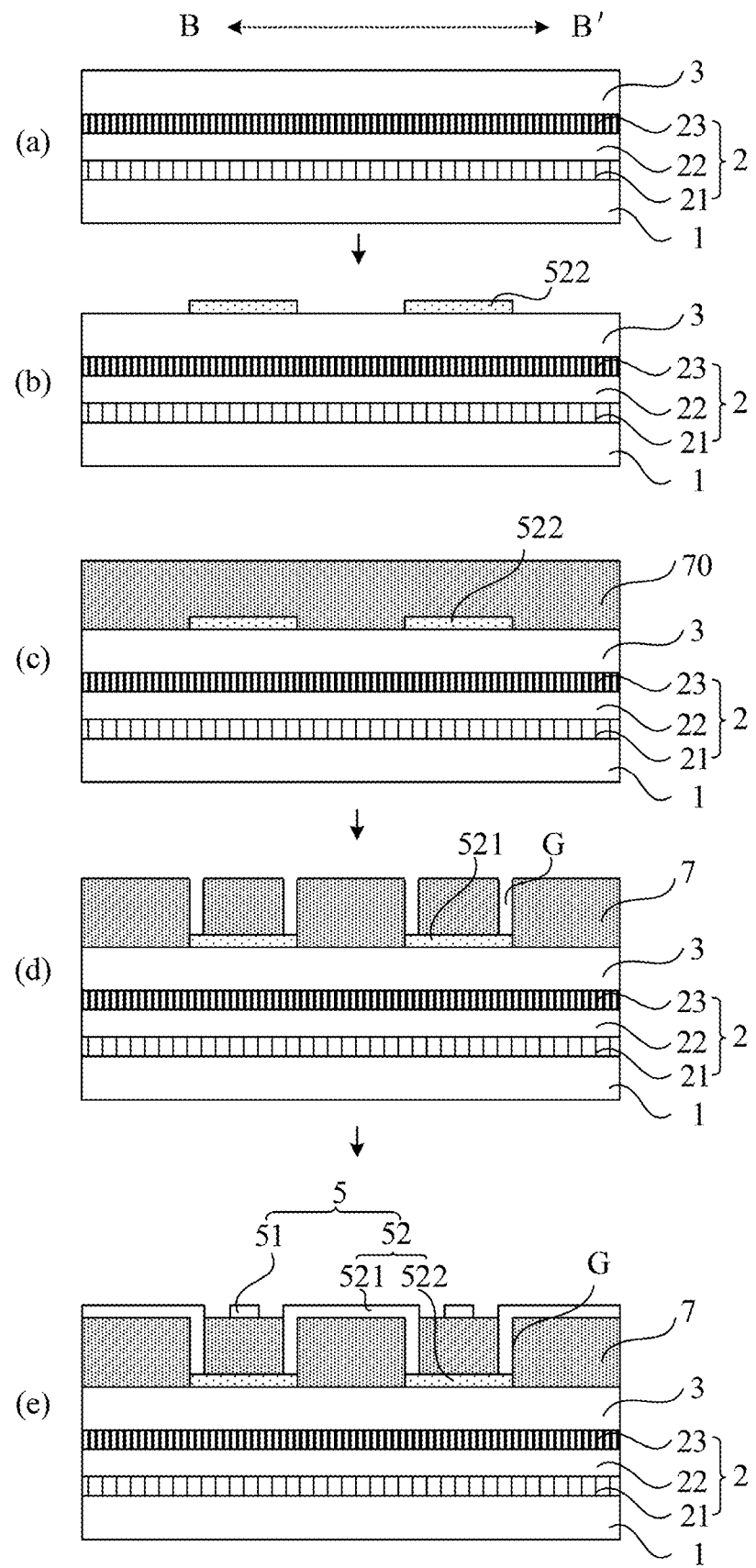
FIG. 11 is a flowchart of manufacturing a display substrate taken along line B-B', according to some embodiments of the present disclosure.

In S200, as shown in (a) in FIG. 10, and (a) in FIG. 11, a light-emitting functional layer 2 and an encapsulating layer 3 are sequentially formed on a side of the base 1. An orthographic projection of the encapsulating layer 3 on the base 1 does not overlap with the binding area 4.

In some examples, an orthographic projection of the light-emitting functional layer 2 on the base 1 is located within the orthographic projection of encapsulating layer 3 on the base 1. By providing the encapsulating layer 3 on a side of the light-emitting functional layer 2, it is possible to use the encapsulating layer 3 to block water and oxygen from entering the light-emitting functional layer 2, so as to prevent external water vapor from corroding the light-emitting functional layer 2 and thus affecting a performance of the display substrate 100.

The encapsulating layer 3 includes a plurality of structures. For example, the encapsulating layer 3 may include a first inorganic layer, an organic layer and a second inorganic layer that are stacked successively in a direction perpendicular to the base 1.

The orthographic projection of the encapsulating layer 3 on the base 1 does not overlap with the binding area 4. That is, the encapsulating layer 3 does not cover the binding area 4. The binding area 4 is exposed during a subsequent process of forming a touch structure 5 on a surface of the encapsulating layer 3 away from the base 1.

Figure 5:
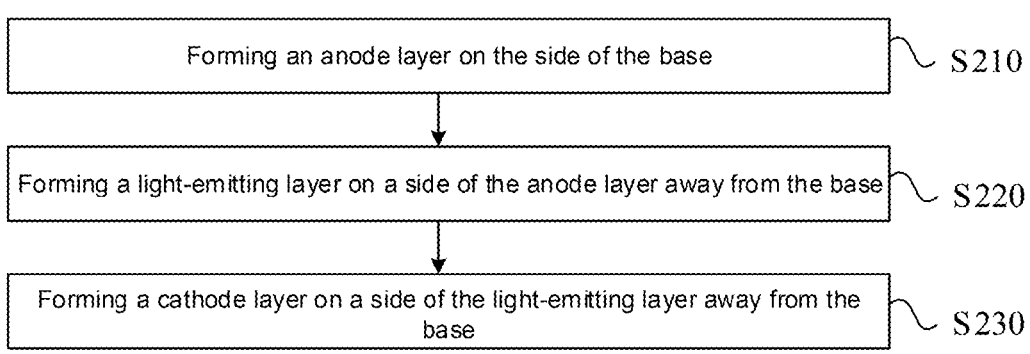
FIG. 5 is a flowchart of a method for manufacturing a light-emitting functional layer, according to some embodiments of the present disclosure.

In some examples, as shown in FIG. 5, in S200, forming the light-emitting functional layer 2 on the side of the base 1 includes steps S210 to S230.

In S210, an anode layer 21 is formed on a side of the base 1.

The anode layer 21 may be made of various types of materials. For example, the material of the anode layer 21 includes indium tin oxide (ITO).

The anode layer 21 may be of various structures. For example, the anode layer 21 includes a plurality of anode patterns that are spaced apart. The display substrate 100 has a plurality of sub-pixels that are spaced apart, and each sub-pixel includes an anode pattern.

In S220, a light-emitting layer 22 is formed on a side of the anode layer 21 away from the base 1.

The light-emitting layer 22 may be made of various types of materials.

For example, the material of the light-emitting layer 22 includes an organic material. In this case, the display substrate 100 may be an OLED display substrate.

For example, the material of the light-emitting layer 22 includes a quantum dot material. In this case, the display substrate 100 may be a QLED display substrate.

In some examples, before the light-emitting layer 22 is formed on the side of the anode layer 21 away from the base 1, a hole injection layer and a hole transport layer are stacked successively on the side of the anode layer 21 away from the base 1.

In S230, a cathode layer 23 is formed on a side of the light-emitting layer 22 away from the base 1.

For example, the cathode layer 23 can be made of aluminum (Al).

The light-emitting layer 23 may be of various structures. For example, the cathode layer 23 includes a plurality of cathode patterns that are spaced apart, and each sub-pixel includes a cathode pattern. For example, the cathode layer 23 is of a planar structure, and the cathode layer 23 is shared by a plurality of sub-pixels.

In some examples, before the cathode layer 23 is formed on the side of the light-emitting layer 22 away from the base 1, an electron transport layer and an electron injection layer are stacked successively on the side of the light-emitting layer 22 away from the base 1.

In some examples, the drive circuit included in the base 1 is configured to provide a drive voltage for the formed display substrate 100. The drive circuit provides a drive voltage for the anode layer 21 and the cathode layer 23 in the light-emitting functional layer 2, so that the light emitting layer 22 in the light-emitting functional layer 2 can emit a light needed for display and thus enable the display substrate 100 to display content.

In S300, as shown in (b)-(e) in FIG. 10, and (b)-(e) in FIG. 11, a touch structure 5 is formed on a surface of the encapsulating layer 3 away from the base 1. The touch structure 5 includes a first part 50 that is in contact with the encapsulating layer 3, and a material of the first part 50 includes a conductive material. The conductive material includes a metal material or a metal oxide material.

Here, the description that the first part 50 is in contact with the encapsulating layer 3 means that the first part 50 is in direct contact with the encapsulating layer 3 and there is no other film therebetween.

In some examples, in S300, forming the first part 50 includes: forming the first part 50 by a nanoimprint process.

Figure 6:
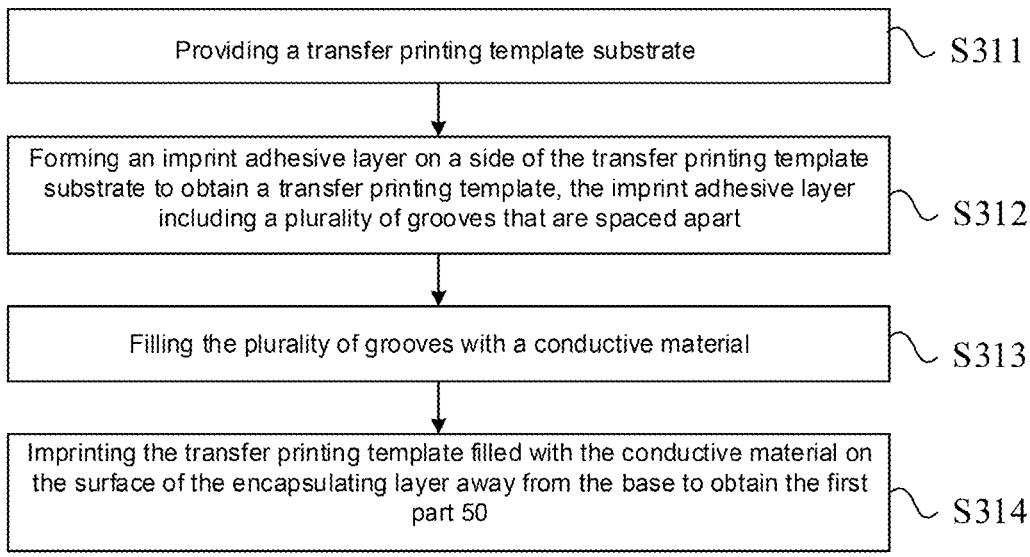
FIG. 6 is a flowchart of forming a first part by a nanoimprint process, according to some embodiments of the present disclosure.

For example, as shown in FIG. 6, forming the first part 50 by the nanoimprint process includes steps S311 to S314.

Figure 12:
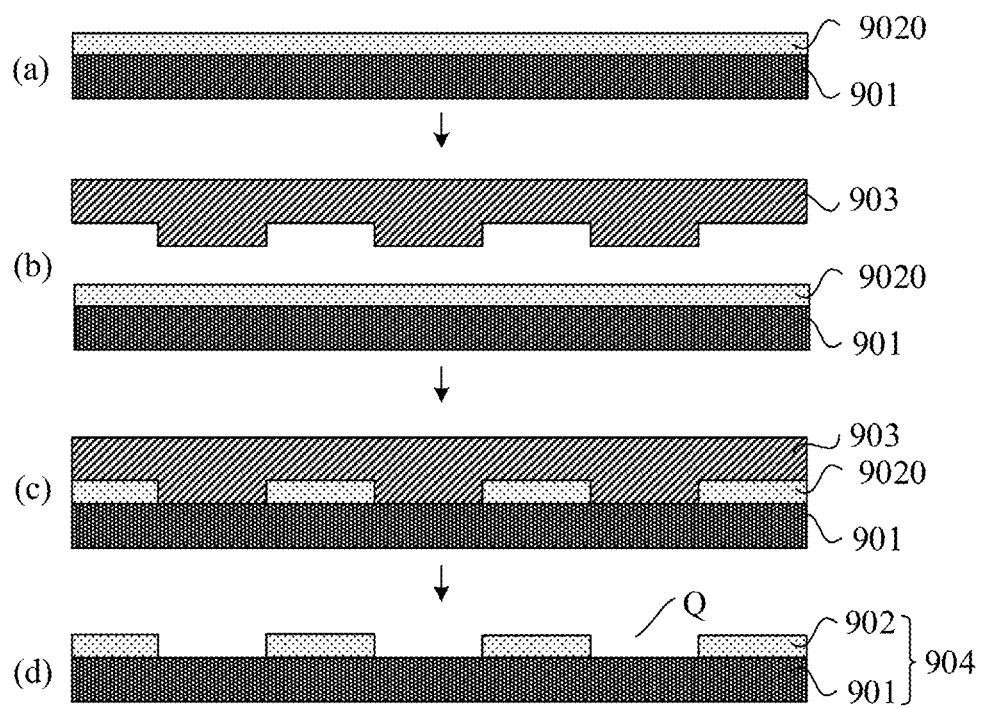
FIG. 12 is a flowchart of manufacturing a transfer printing template, according to some embodiments of the present disclosure.

In S311, as shown in FIG. 12, a transfer printing template substrate 901 is provided.

In S312, as shown in FIG. 12, an imprint adhesive layer 902 is formed on a side of the transfer printing template substrate 901 to obtain a transfer printing template 904. The imprint adhesive layer 902 includes a plurality of grooves Q that are spaced apart.

For example, as shown in (a) in FIG. 12, when the imprint adhesive layer 902 is formed on the side of the transfer printing template substrate 901, a coating process can be used to coat a surface of the transfer printing template substrate 901 with an imprint adhesive material to form an imprint adhesive film 9020. As shown in parts (b) and (c) of FIG. 12, an imprint template 903 is pressed into the imprint adhesive film 9020, so that ridges of the imprint template 903 are in direct contact with a surface of the transfer printing template substrate 901, and the imprint adhesive material moves into concave parts of the imprint template 903 under a pressing action of the imprint template 903. After that, the imprint adhesive that has moved into the concave parts of the imprint template 903 is cured and shaped by a photo-curing treatment (such as an ultraviolet irradiation) to form the imprint adhesive layer 902. As shown in (d) in FIG. 12, the imprint template 903 is removed to obtain a required transfer printing template 904.

The imprint adhesive layer 902 includes a plurality of grooves Q that are spaced apart. The plurality of grooves Q correspond to the ridges of the imprint template 903. In other words, the grooves and the ridges are identical in shape, size, etc.

Here, a volume of the imprint adhesive film 9020 may be equal to a volume of all concave parts of the imprint template 903. In this way, there is no residual imprint adhesive in concave parts (the plurality of grooves of the imprint adhesive layer 902) of the transfer printing template 904, and a size of a ridge (a ridge of the imprint template 902) of the formed transfer printing template 904 is the same as a size of the corresponding concave parts of the imprint template 903.

Based on this, by controlling the size of the concave parts and ridges of the imprint template 903, it may be possible to control sizes of the concave parts and ridges of the transfer printing template 904, and thus control a size of the first part 50 formed subsequently.

In some examples, the imprint adhesive is for example an ultraviolet curable adhesive. Materials of the imprint template 903 and the transfer printing template substrate 901 are both flexible nanomaterials.

Figure 13:
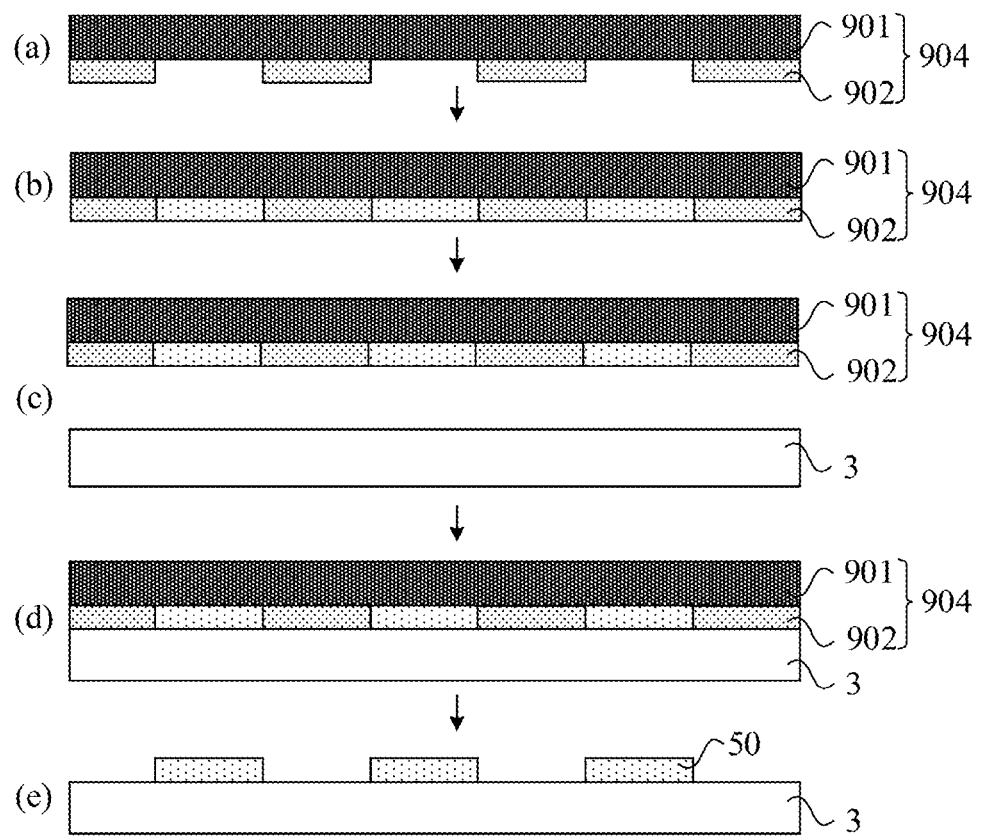
FIG. 13 is a flowchart of forming a first part by a nanoimprint process, according to some embodiments of the present disclosure.

In S313, as shown in parts (a) and (b) in FIG. 13, the plurality of grooves Q are filled with a conductive material.

For example, the conductive material may be metal ink or a transparent metal oxide material.

In S314, as shown in parts (c), (d) and (e) in FIG. 13, the transfer printing template 904 filled with the conductive material is imprinted on the surface of the encapsulating layer 3 away from the base 1 to obtain the first part 50.

After the conductive material is filled in the plurality of grooves Q of the transfer printing template 904 and imprinted on the encapsulating layer 3, the conductive material can be shaped. After the conductive material is shaped, the transfer printing template 904 is removed to obtain the first part 50.

A pattern of the first part 50 formed on the encapsulating layer 3 is complementary to a pattern of the transfer printing template 904.

In addition, when the first part 50 is formed by a nanoimprint process, the first part 50 may not only be formed by imprinting the imprint template 904, but may also be (not limited to) imprinted by an imprinting of an imprinting roller. It will be noted that in a process of forming the first part 50 by a nanoimprint process, the binding area 4 is exposed, and orthographic projections of the concave parts of the transfer printing template 904 (i.e., the plurality of grooves Q) on the base 1 does not overlap with the binding area 4. That is, an orthographic projection of the first part 50 on the base 1 does not overlap with the binding area 4. In this way, it may be possible to avoid damage to a plurality of welding points in the binding area 4, and avoid a short connection between the first part 50 and the plurality of welding points.

Thus, in the method for manufacturing a display substrate provided by embodiments of the present disclosure, after the light-emitting functional layer 2 and the encapsulating layer 3 are successively formed on one side of the base 1, in forming the first part 50 in the touch structure that is in contact with the encapsulating layer 3 and includes the conductive material by the nanoimprint process, the first part 50 can be formed only on the surface of the encapsulating layer 3 away from the base 1 but not on the binding area 4 during the forming process. Thus, compared with the related art, in the method for manufacturing a display substrate provided by the embodiments of the present disclosure, the binding area 4 can be protected without forming the barrier layer 6', which effectively simplifies a structure and production process of the display substrate 100, and effectively reduces a thickness and a film stress of the display substrate 100. It is conducive to making display apparatuses thinner and more flexible in a case where the display substrate 100 is applied to a display apparatus (i.e., a touch display panel).

In the embodiments of the present disclosure, there may be various methods for forming the touch structure 5 on the side surface of the encapsulating layer 3 away from the base 1 in S300, and which method to use depends on the structure of the touch structure 5. A method to be used for forming the touch structure 5 can be selected according to actual needs.

Figure 7:
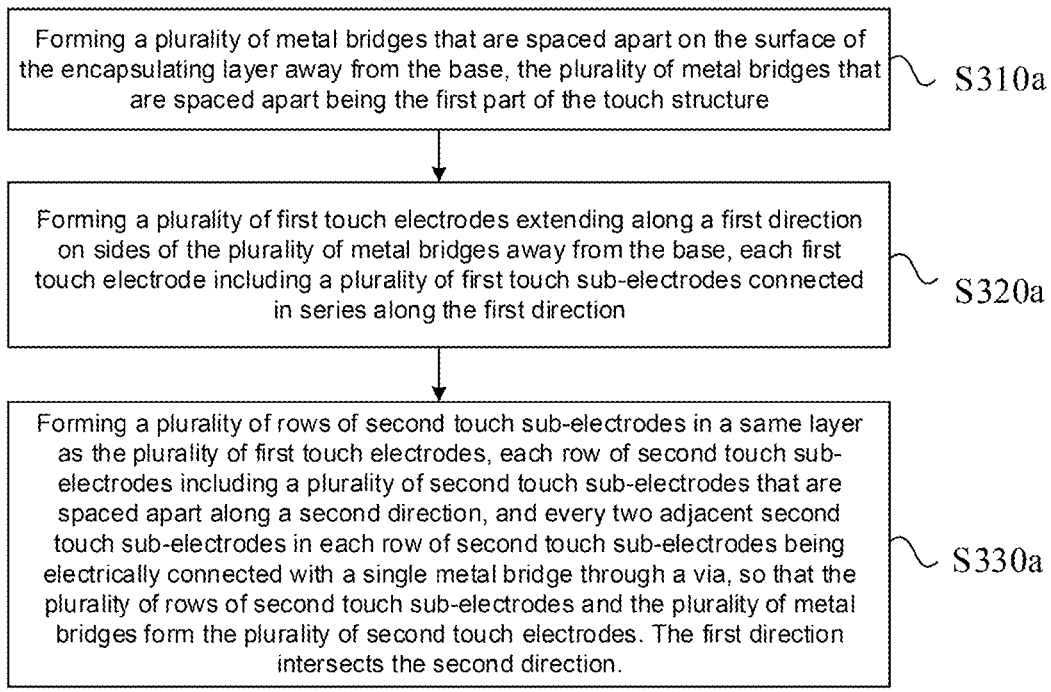
FIG. 7 is a flowchart of a method for manufacturing a touch structure, according to some embodiments of the present disclosure.

In some embodiments, as shown in FIG. 7, forming the touch structure 5 on the surface of the encapsulating layer 3 away from the base 1 in S300 includes steps S310a to S330a.

In S310a, as shown in (b) in FIG. 10, and (b) in FIG. 11, a plurality of metal bridges 522 that are spaced apart are formed on the surface of the encapsulating layer 3 away from the base 1. The plurality of metal bridges 522 that are spaced apart are the first part 50 of the touch structure 5.

The plurality of metal bridges 522 are formed by a nanoimprint process. In this way, the conductive material for forming the plurality of metal bridges 522 can form the plurality of metal bridges 522 in a region where the touch structure 5 is to be formed after being shaped, so that it may be avoided that the plurality of metal bridges 522 are formed within the binding area 4.

In S320a, as shown in (e) in FIG. 10 and (e) in FIG. 11, a plurality of first touch electrodes 51 extending along a first direction X are formed on sides of the plurality of metal bridges 522 away from the base 1. Each first touch electrode 51 includes a plurality of first touch sub-electrodes 511 connected in series along the first direction X.

The plurality of first touch electrodes 51 extend along the first direction X. That is, the plurality of first touch electrodes 51 are arranged parallel to each other. Of course, the plurality of first touch electrodes 51 can also be arranged approximately parallel to each other (that is, there is an angle among the plurality of first touch electrodes 51), as long as there is no electrical connection among the plurality of first touch electrodes 51.

A plurality of first touch sub-electrodes 511 in each first touch sub-electrode 51 are connected in series along the first direction X. That is, the plurality of first touch sub-electrodes 511 are successively arranged along the first direction X, and two adjacent first touch sub-electrodes 511 are electrically connected.

In some examples, each first touch electrode 51 is an integrated structure.

In S330a, as shown in (e) in FIG. 10 and (e) in FIG. 11, a plurality of rows of second touch sub-electrodes 521 are formed in a same layer as the plurality of first touch electrodes 51. Each row of second touch sub-electrodes 521 includes a plurality of second touch sub-electrodes 521 that are spaced apart along a second direction Y. Every two adjacent second touch sub-electrodes 521 in each row of second touch sub-electrodes 521 are electrically connected with a single metal bridge 522 through a via G, so that the plurality of rows of second touch sub-electrodes 521 and the plurality of metal bridges 522 form the plurality of second touch electrodes 52. The first direction X intersects the second direction Y.

Here, the first direction X and the second direction Y are both perpendicular to a thickness direction of the encapsulating layer 3. In addition, a magnitude of the angle between the first direction X and the second direction Y can be set according to actual needs. For example, the two directions are perpendicular to each other.

The term "row" mentioned herein does not refer to a row direction on paper, but refers to a direction parallel to the second direction Y. In some cases, embodiments involving the "row direction" may be implemented in the case of a "column direction", and vice versa. It still falls within the scope of the claims to be protected by the present disclosure if the solution of the present disclosure is rotated by 90° or mirrored.

The plurality of second touch electrodes 52 are arranged parallel to each other. Of course, the plurality of second touch electrodes 52 can also be arranged approximately parallel to each other (that is, there is an angle among the plurality of second touch electrodes 52), as long as there is no electrical connection among the plurality of second touch electrodes 52.

In some examples, as shown in (e) in FIG. 11, the description that every two adjacent second touch sub-electrodes 521 are electrically connected with a single metal bridge 522 through a via G means that each second touch sub-electrode 521 is electrically connected to a single metal bridge 522 through a single via G, and every two adjacent second touch sub-electrodes 521 are electrically connected to a metal bridge 522 through their respective corresponding vias G, but not electrically connected a metal bridge 522 through a same via G.

It will be noted that the "same layer" herein refers to a layer structure formed by forming a film layer that is used for forming a specific pattern through a same film-forming process and then performing a single patterning process on the film layer with a same mask. Depending on the specific pattern, a single patterning process may include multiple exposure, development or etching processes, and the specific pattern formed in the layer structure may be continuous or discontinuous and may be at different heights or have different thicknesses. In this way, the plurality of first touch electrodes 51 and the plurality of rows of second touch sub-electrodes 521 can be fabricated at the same time, which is conducive to simplifying a manufacturing process of the display substrate 100.

In the embodiments of the present disclosure, since the metal bridges 522 in the touch structure 5 are formed on the surface of the encapsulating layer 3 by a nanoimprint process, compared with the method for manufacturing a display substrate in the related art, a step of forming the barrier layer 6' can be omitted before forming the touch structure 5, which simplifies the structure and manufacturing process of the display substrate 100, and reduces the thickness and the film stress of the display substrate 100. In the case where the display substrate 100 is applied to a display apparatus, the method provided in the present disclosure is conducive to making display panels thinner and more flexible.

Figure 8:
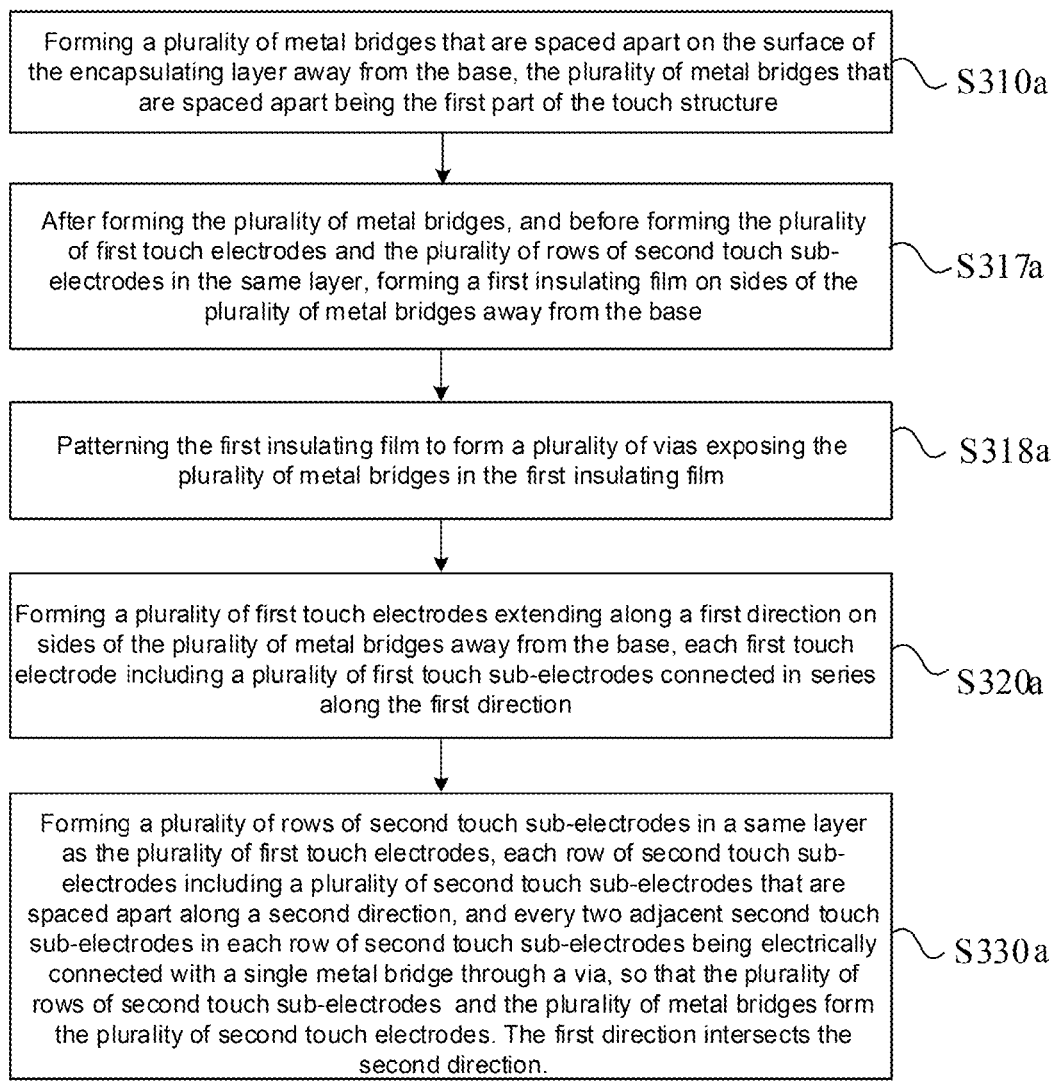
FIG. 8 is a flowchart of another method for manufacturing a touch structure, according to some embodiments of the present disclosure.

In some examples, as shown in FIG. 8, the method for manufacturing the display substrate further includes steps S317a to S318a.

In S317a, as shown in (c) in FIG. 10 and (c) in FIG. 11, after forming the plurality of metal bridges 522, and before forming the plurality of first touch electrodes 51 and the plurality of rows of second touch sub-electrodes 521 in the same layer, a first insulating film 70 is formed on sides of the plurality of metal bridges 522 away from the base 1.

In S318a, as shown in (D) in FIG. 10 and (D) in FIG. 11, the first insulating film 70 is patterned to form a plurality of vias G exposing the plurality of metal bridges 522 in the first insulating film 70. In this way, a first insulation layer 7 is obtained.

In the embodiments of the present disclosure, after S310 and before S320 and S330, the first insulation layer 7 is formed on the sides of the plurality of metal bridges 522 away from the base 1. In this way, the plurality of first touch electrodes 51 and the plurality of rows of second touch sub-electrodes 521 may be formed on a surface of the first insulating layer 7 away from the base 1, and may be insulated from the plurality of metal bridges 522. Then, the plurality of rows of second touch sub-electrodes 521 may be electrically connected with the plurality of metal bridges 522 through a plurality of vias G in the first insulating layer 7 to form a plurality of second touch electrodes 52.

Structures of the plurality of the first touch sub-electrodes 511 and the plurality of rows of the second touch sub-electrodes 521 are of various types, and are related to their materials.

Figure 16:
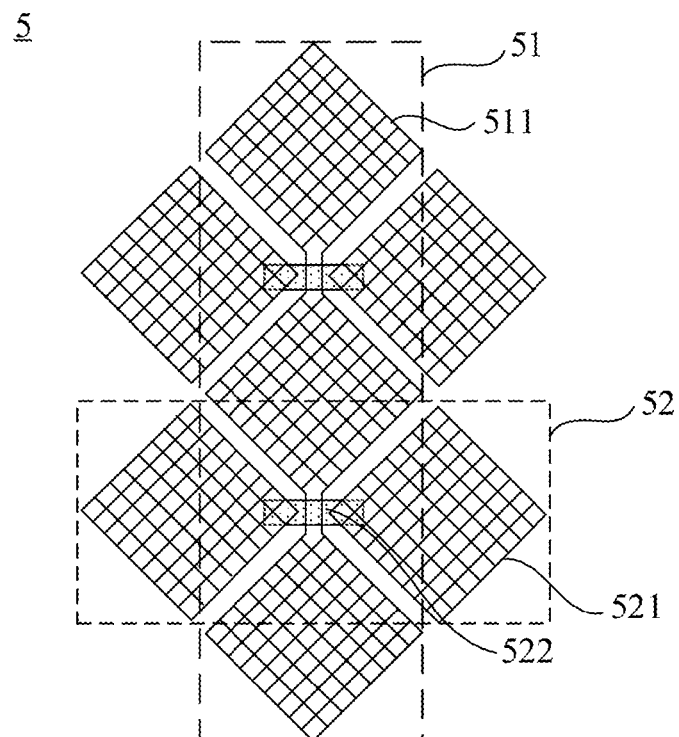
FIG. 16 is a structural diagram of a touch structure, according to some embodiments of the present disclosure.

In some examples, as shown in FIG. 16, the plurality of first touch sub-electrodes 511 and the plurality of rows of second touch sub-electrodes 521 are both in a grid structure, and materials of first touch sub-electrodes 511 and the plurality of rows of second touch sub-electrodes 521 are all metal materials.

A shape of a grid in the grid structure may be a regular polygon or an irregular polygon, and the shape of the grid can be selected according to actual needs. Taking a first touch sub-electrode 511 in FIG. 16 as an example, a plurality of metal wires cross each other to form a plurality of diamond-shaped grids. As for the display structure 100 applied to a display apparatus of any size, a relevant software may be used to perform an optical simulation before fabricating the plurality of first touch sub-electrodes 511 and the plurality of rows of second touch electrodes 521 of the grid structure, so that parameters of the grids of the plurality of first touch sub-electrodes 511 and the plurality of rows of second touch sub-electrodes 521 match the display structure 100. For example, as for a diamond-shaped grid, an appropriate diamond side length and an appropriate included angle may be obtained through simulation. In this way, it may be possible to avoid interference fringes on the display apparatus after the display substrate 100 is applied to the display apparatus due to a mismatch between the grid structure and the display substrate 100.

In a case where the materials of the plurality of first touch sub-electrodes 511 and the plurality of rows of second touch sub-electrodes 521 are all metal materials and are both in a grid structure, it may be possible to ensure that not only the touch structure 5 has a high light transmittance, but also the plurality of first touch sub-electrodes 511 and the plurality of rows of second touch sub-electrodes 521 have a low resistance and a high conductivity. Thus, it may be possible to avoid a transmission delay of an electric signal in the plurality of first touch sub-electrodes 511 and the plurality of rows of second touch sub-electrodes 521, which is conducive to improving a sensitivity and a touch effect of the touch structure 5.

Figure 14:
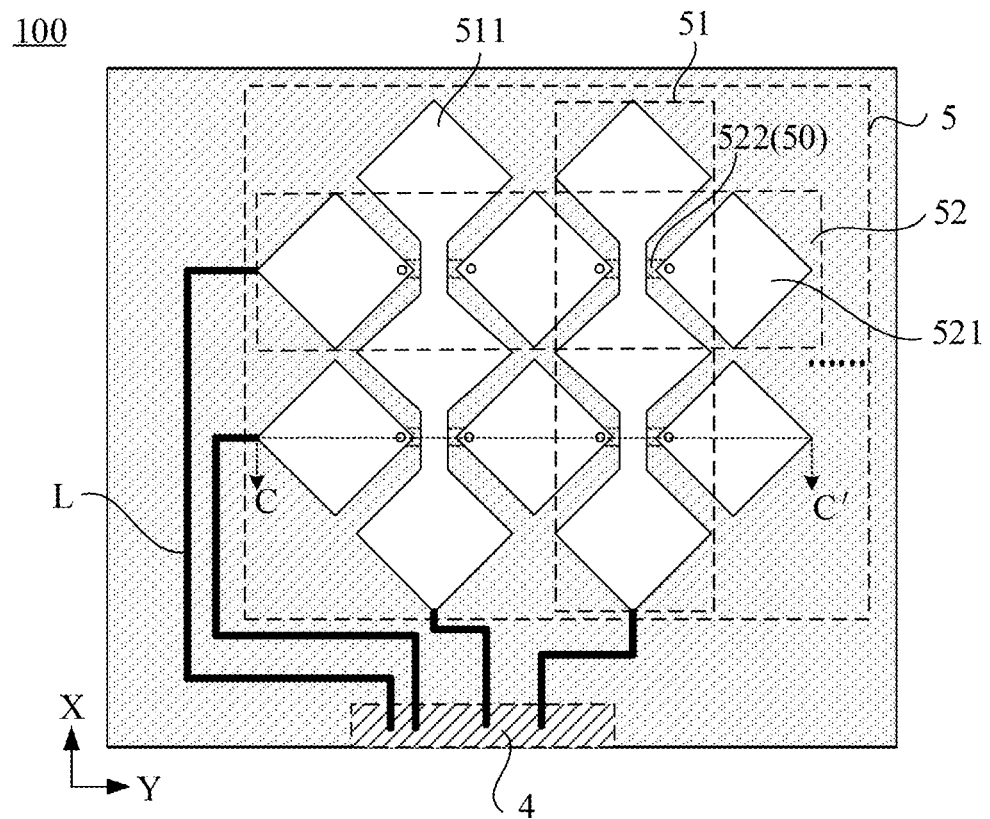
FIG. 14 is a top view of a display substrate, according to some embodiments of the present disclosure.

In some other examples, as shown in FIG. 14, the plurality of first touch sub-electrodes 511 and the plurality of rows of second touch sub-electrodes 521 may both be in a planar structure, and materials of the plurality of first touch sub-electrodes 511 and the plurality of rows of second touch sub-electrodes 521 are all indium tin oxide (ITO).

By using a light-transmitting material to form the plurality of first touch sub-electrodes 511 and the plurality of rows of second touch sub-electrodes 521, it may be possible to simplify the structures of the plurality of first touch sub-electrodes 511 and the plurality of rows of second touch sub-electrodes 521 while ensuring that touch structure 5 has a high light transmittance. Thereby, a manufacturing process of the display substrate 100 may be simplified, and a production efficiency of the display substrate 100 may be improved.

Figure 9:
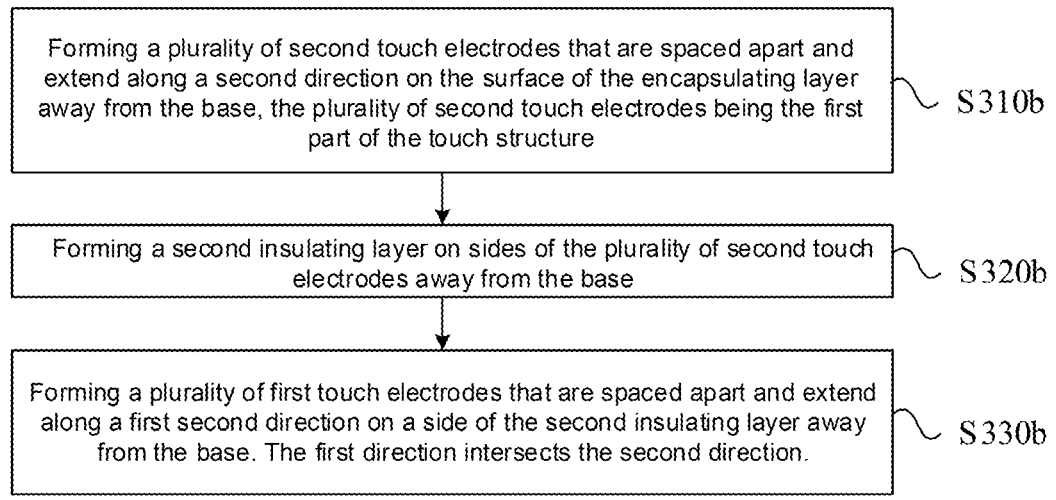
FIG. 9 is a flowchart of yet another method for manufacturing touch structure, according to some embodiments of the present disclosure.

In some other embodiments, as shown in FIG. 9, forming the touch structure 5 on the surface of the encapsulating layer 3 away from the base 1 in S300 includes steps S310b to S330b.

Figure 17:
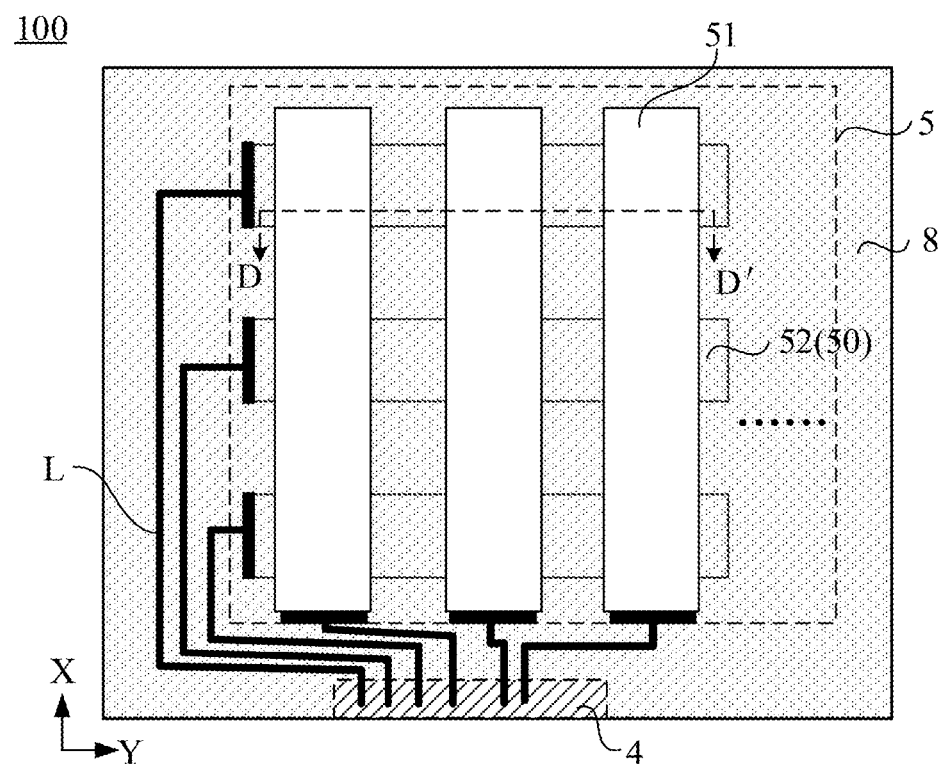
FIG. 17 is a top view of another display substrate, according to some embodiments of the present disclosure.
Figure 18:
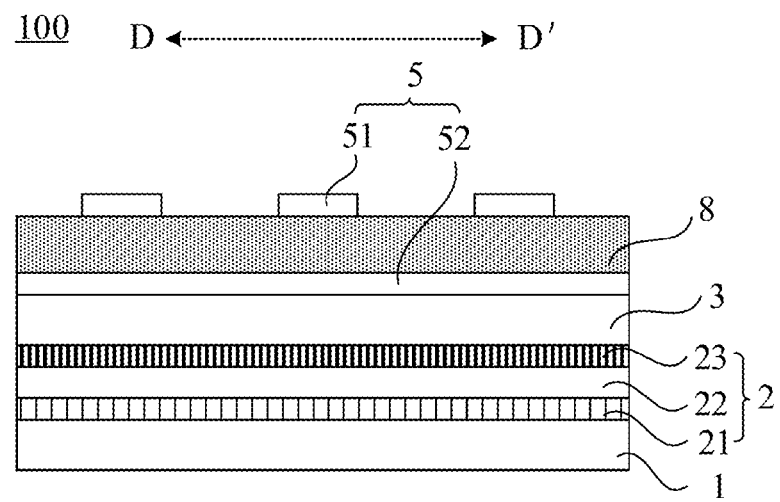
FIG. 18 is a cross-sectional view of the display substrate shown in FIG. 17 taken along line D-D'.

In S310b, referring to FIGS. 17 and 18, a plurality of second touch electrodes 52 that are spaced apart and extend along a second direction Y are formed on the surface of the encapsulating layer 3 away from the base 1. The plurality of second touch electrodes 52 are the first part 50 of the touch structure 5.

The plurality of second touch electrodes 52 are formed by a nanoimprint process. In this way, the conductive material used for forming the plurality of second touch electrodes 52 can form the plurality of second touch electrodes 52 in a region where the touch structure 5 is to be formed after being shaped, and it is possible to prevent the plurality of second touch electrodes 52 from being formed within the binding area 4.

In S320b, referring to FIGS. 17 and 18, a second insulating layer 8 is formed on sides of the plurality of second touch electrodes 52 away from the base 1.

Here, the second insulating layer 8 may expose the binding area 4. That is, the second insulating layer 8 does not cover the binding area 4.

In S330b, referring to FIGS. 17 and 18, a plurality of first touch electrodes 51 that are spaced apart and extend along a first direction X are formed on a side of the second insulating layer 8 away from the base 1. The first direction X intersects the second direction Y.

In some examples, the plurality of first touch electrodes 51 are formed by a nanoimprint process. In this way, in the process of forming the plurality of first touch electrodes 51, the plurality of first touch electrodes 51 can be obtained after shaping the material use for forming the plurality of first touch electrodes 51. In this case, it may be possible to prevent the plurality of first touch electrode 51 from being formed within the binding area 4, and avoid the formation of the barrier layer 6'.

Herein, with regard to the method of forming the first touch electrode 51 by a nanoimprint process, reference can be made to the method for forming the first part 50 of the touch structure 5.

For example, a material of the second insulating layer 8 may be an inorganic material, such as silicon nitride, or an organic resin material, such as acrylic glue. By providing the second insulating layer 8, it may be possible to insulate the plurality of first touch electrodes 51 and the plurality of second touch electrodes 52 from each other and thus avoid a short connection therebetween.

The structures of the plurality of first touch electrodes 51 and the plurality of second touch electrodes 52 are of various types, and are related to their respective materials.

Figure 19:
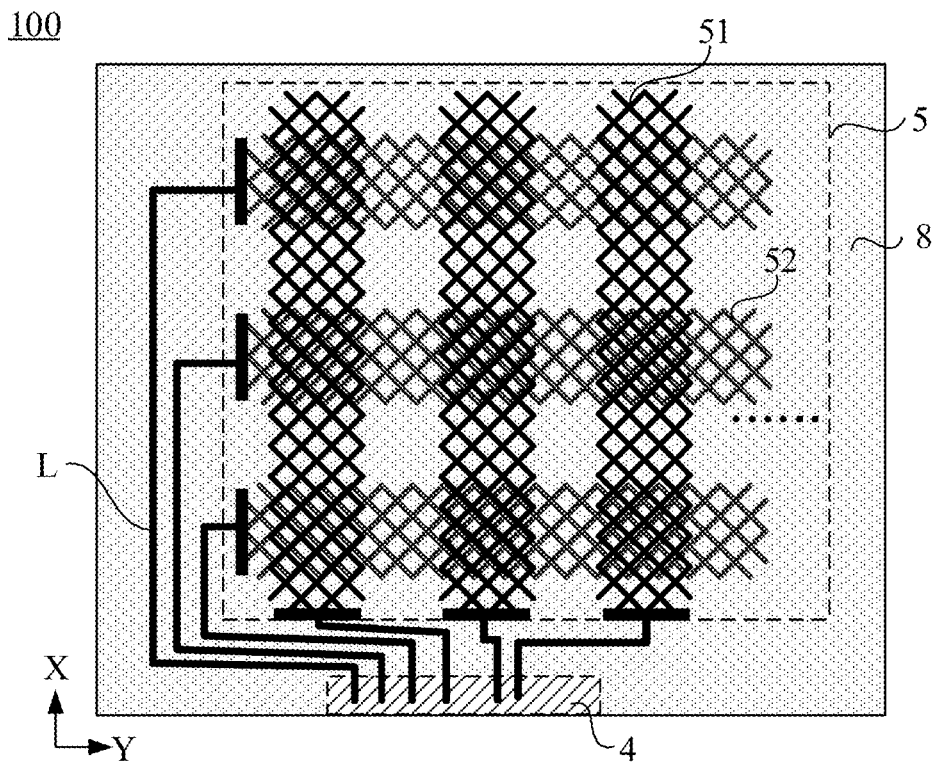
FIG. 19 is a top view of yet another display substrate, according to some embodiments of the present disclosure.

In some examples, as shown in FIG. 19, the plurality of first touch electrodes 51 and the plurality of second touch electrodes 52 are both in a grid structure, and the materials of the plurality of first touch electrodes 51 and the plurality of second touch electrodes 52 are metal oxide materials.

A shape of a grid in the grid structure may be a regular polygon or an irregular polygon, and the shape of the grid can be set according to actual needs. Taking the first touch electrodes 51 as an example, a plurality of metal oxide wires cross each other to form a plurality of diamond-shaped grids (as shown in FIG. 19). As for the display structure 100 applied to a display apparatus of any size, a relevant software may be used to perform an optical simulation before fabricating the plurality of first touch electrodes 51 and the plurality of second touch electrodes 52 of the grid structures, so that parameters of the grids of the plurality of first touch electrodes 51 and the plurality of second touch electrodes 52 match the display structure 100. For example, as for a diamond-shaped grid, an appropriate diamond grid side length and an appropriate included angle can be obtained through a simulation. In this way, it may be possible to avoid interference fringes on the display apparatus after the display substrate 100 is applied to the display apparatus due to a mismatch between the grid structure and the display substrate 100.

In addition, in a case where the plurality of first touch electrodes 51 and the plurality of second touch electrodes 52 are both in a grid structure and their materials are metal oxide materials, it may be possible to ensure that not only the touch structure 5 has a high light transmittance, but also the touch structure 5 has a low resistance and a high conductivity. In this way, it may be possible to avoid a transmission delay of an electric signal in the touch structure 5, and thus improve a touch effect of the touch structure 5.

In some other examples, as shown in FIG. 17, the plurality of first touch electrodes 51 and the plurality of second touch electrodes 52 may both be in a planar structure, and the materials of the plurality of first touch electrodes 51 and the plurality of second touch electrodes 52 are all indium tin oxide (ITO).

By using a light-transmitting material to form the plurality of first touch electrodes 51 and the plurality of second touch electrodes 52, it may be possible to simplify the structures of the plurality of first touch electrodes 51 and the plurality of second touch electrodes 52 while ensuring that touch structure 5 has a high light transmittance. Therefore, the manufacturing process of the display substrate 100 may be simplified, and a production efficiency of display substrate 100 may be improved.

In the embodiments of the present disclosure, since the touch structure 5 is in direct contact with the encapsulating layer 3, compared with the display substrate 100' in the related art, the step of forming the barrier layer 6' can be omitted, which simplifies the structure and manufacturing process of the display substrate 100, and reduces the thickness and the film stress of the display substrate 100. It is conducive to making display panels thinner and more flexible in the case where the display substrate 100 is applied to a display apparatus.

Some embodiments of the present disclosure provide a display substrate 100. As shown in FIGS. 14, 15, 17 and 18, the display substrate 100 includes: a base 1, a light-emitting functional layer 2 and an encapsulating layer 3 that are provided successively on a side of the base 1, and a touch structure 5 provided on a surface of the encapsulating layer 3 away from the base 1.

In some examples, the base 1 includes a base substrate and a drive circuit provided on the base substrate. Herein, as for description of the base substrate and the drive circuit, reference may be made to the description of the base substrate and the drive circuit in some of the above embodiments.

The light-emitting functional layer 2 may be of various structures, which may be selected according to actual needs.

Figure 15:
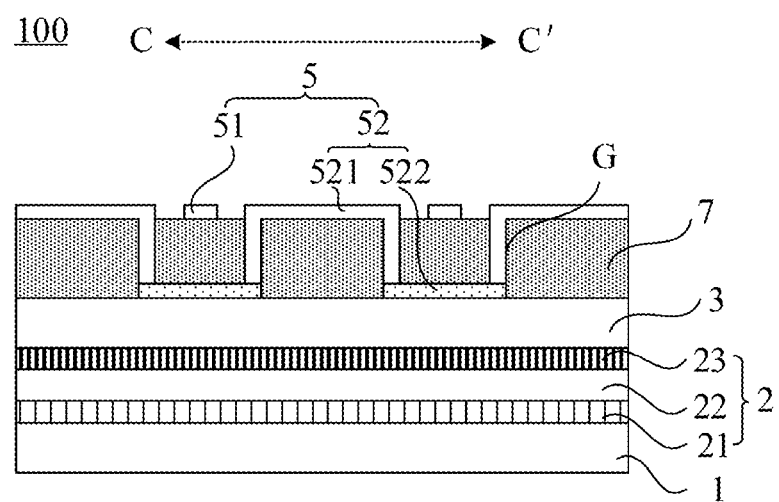
FIG. 15 is a cross-sectional view of the display substrate shown in FIG. 14 taken along line C-C'.

In some examples, as shown in FIGS. 15 and 18, the light-emitting functional layer 2 includes: an anode layer 21 provided on a side of the base 1, a light-emitting layer 22 provided on a side of the anode layer 21 away from the base 1, and a cathode layer 23 provided on a side of the light-emitting layer 22 away from the base 1.

In some other examples, a hole injection layer and a hole transmission layer are provided between the anode layer 21 and the light emitting layer 22, and an electron transmission layer and an electron injection layer are provided between the light emitting layer 22 and the cathode layer 23.

Figure 20:
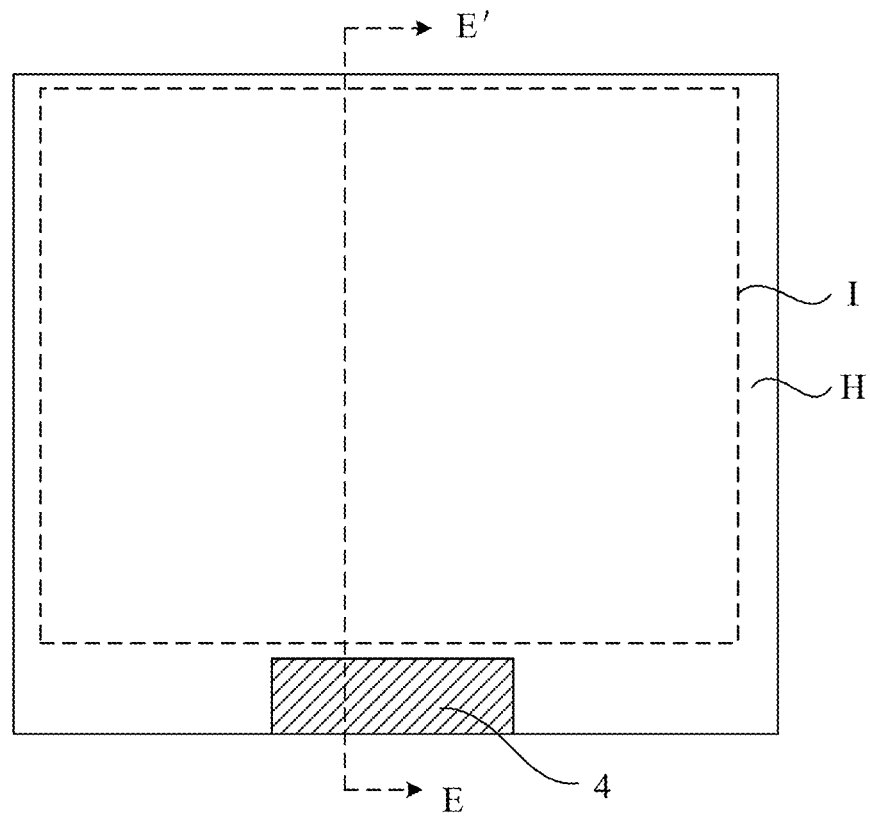
FIG. 20 is a top view of yet another display substrate, according to some embodiments of the present disclosure.
Figure 22:
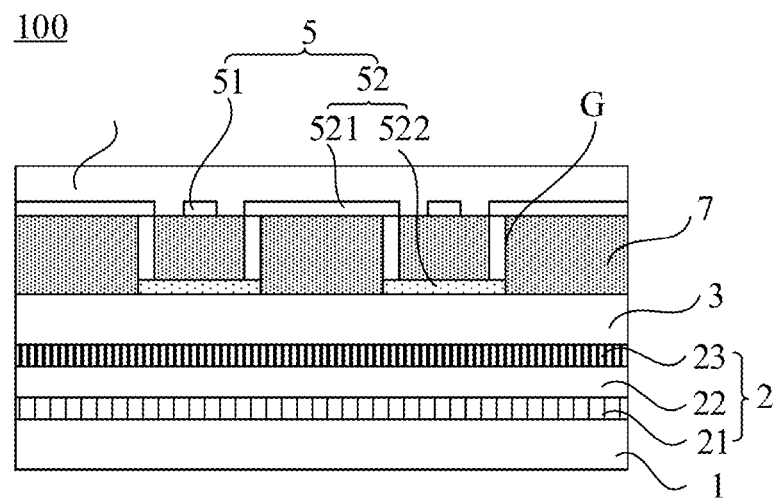
FIG. 22 is a cross-sectional view of yet another display substrate, according to some embodiments of the present disclosure.

As shown in FIGS. 20 and 22, the base 1 has a display area I and a non-display area H located on at least one side of the display area I. The non-display area H includes a binding area 4.

Herein, the light-emitting layer 2 is located in the display area I, and an orthographic projection of the light-emitting layer 2 on the base 1 is located within an orthographic projection of the encapsulating layer 3 on the base 1. In this way, the encapsulating layer 3 can be used to block water and oxygen from entering the light-emitting functional layer 2, so as to prevent external water vapor from corroding the light-emitting functional layer 2 and thus affecting the performance of the display substrate 100.

In some examples, the encapsulating layer 3 is a film encapsulation layer.

The orthographic projection of the encapsulating layer 3 on the base 1 does not overlap with the binding area 4. That is to say, the encapsulating layer 3 does not cover the binding area 4.

In some examples, the touch structure 5 includes a first part 50 that is in contact with the encapsulating layer 3, and a material of the first part 50 includes a conductive material.

The conductive material herein may be of various types. For example, the conductive material may be an elemental metal, such as Au (gold), Ag (silver), Cu (copper) or Al (aluminum), etc. For example, the conductive material may also be a metal alloy, such as AlNb (aluminum niobium alloy), etc.

It will be noted that the first part 50 is formed by a nanoimprint process and is directly formed on the surface of the encapsulating layer 3 away from the base 1, and thus basically will not affect the binding area 40. An orthographic projection of the first part 50 on the base 1 does not overlap with the binding area 4. That is, the first part 50 is not formed within the binding area 4. In this way, it may be possible to prevent the first part 50 from affecting the binding area 4.

In the display substrate 100 provided by the embodiments of the present disclosure, by providing the light-emitting functional layer 2 and the encapsulating layer 3 on the side of the base 1 and by directly providing the first part 50 of the touch structure 5 that is formed by a nanoimprint process on the surface of the encapsulating layer 3 away from the base 1, compared with the structure shown in FIG. 3 in the related art, the display substrate 100 provided in the embodiments of the present disclosure has omitted a step of forming the barrier layer 6', which simplifies the structure and manufacturing process of the display substrate 100, and reduces the thickness and film stress of the display substrate 100. It is conducive to making display panels thinner and more flexible in the case where the display substrate 100 is applied to a display apparatus.

The touch structure 5 may be of various structures, which may be selected according to actual needs.

In some embodiments, as shown in FIG. 14, the first part 50 of the touch structure 5 includes a plurality of metal bridges 522 that are spaced apart. The touch structure 5 further includes a plurality of first touch electrodes 51 extending along the first direction X. For example, each first touch electrode 51 includes a plurality of first touch sub-electrodes 511 connected in series. For example, each first touch electrode 51 is an integrated structure.

In some examples, the touch structure 5 further includes a plurality of rows of second touch sub-electrodes 521. Each row of second sub-electrodes 521 includes a plurality of second touch sub-electrodes 521 that are spaced apart along a second direction Y. Every two adjacent second touch sub-electrodes 521 in each row of second touch sub-electrodes 521 are electrically connected with a single metal bridge 522 through a via G, so that the plurality of rows of second touch sub-electrodes 521 and the plurality of metal bridges 522 form the plurality of second touch electrodes 52.

In some examples, as shown in FIG. 15, a first insulating layer 7 is provided between the plurality of metal bridges 522 and the plurality of first touch sub-electrodes 511, and between the plurality of metal bridges 522 and the plurality of second touch sub-electrodes 521. A plurality of vias G are provided in the first insulating layer 7, and the plurality of vias G expose surfaces of the plurality of metal bridges 522 away from the base 1. Each second touch electrode 521 is electrically connected to a single metal bridge 522 through a via G.

The material of the first insulating layer 7 may be of various types. For example, the material of the first insulating layer 7 may be an inorganic material (such as silicon nitride), or an organic material.

In some examples, the plurality of first touch electrodes 511 and the plurality of rows of second touch electrodes 521 are of a same material, and the plurality of first touch electrodes 511 and the plurality of rows of second touch electrodes 521 are disposed in a same layer. In this way, the manufacturing process of the display substrate 100 may be simplified.

It will be understood that there are multiple first touch electrodes 51 and second touch electrodes 52, and the number of the first touch electrodes 51 and the number of the second touch electrodes 52 may be the same or different. The number of the first touch electrodes 51 and the number of the second touch electrodes 52 may be set according to actual needs.

In some examples, the plurality of first touch electrodes 51 are electrically disconnected with each other, and the plurality of rows of second touch electrodes 52 are electrically disconnected with each other.

The structures of the plurality of first touch electrodes 511 and the plurality of second touch electrodes 521 may be of various types, and are related to their respective materials.

In some examples, as shown in FIG. 16, the plurality of first touch sub-electrodes 511 and the plurality of rows of second touch sub-electrodes 521 are both in a grid structure, and the materials of the plurality of first touch sub-electrodes 511 and the plurality of rows of second touch sub-electrodes 521 are all metal materials.

A shape of a grid in the grid structure may be a regular polygon or an irregular polygon, and the shape of the grid can be selected according to actual needs. Taking a first touch sub-electrode 511 in FIG. 16 as an example, a plurality of metal wires cross each other to form a plurality of diamond-shaped grids. As for a display structure 100 applied to a display apparatus of any size, a relevant software may be used to perform an optical simulation before fabricating the plurality of first touch sub-electrodes 511 and the plurality of rows of second touch electrodes 521 of the grid structure, so that parameters of the grids of the plurality of first touch sub-electrodes 511 and the plurality of rows of second touch sub-electrode 521 match the display substrate. For example, as for a diamond-shaped grid, an appropriate diamond grid side length and an appropriate included angle can be obtained through a simulation. In this way, it may be possible to avoid interference fringes on the display apparatus after the display substrate 100 is applied to the display apparatus due to a mismatch between the grid structure and the display substrate 100.

Due to a light-transmissivity of the metal grid structure, and a low resistance and good conductivity of the metal material, it may be possible to avoid a transmission delay of an electric signal in the plurality of first touch sub-electrodes 511 and the plurality of rows of second touch sub-electrodes 521 while ensuring a high light transmittance of the touch structure 5. This is conducive to improving the sensitivity of the touch control structure 5 and the touch effect of the touch structure 5.

In addition, the display substrate 100 may also be driven by an IC (Integrated Circuit) when applied to a large-sized display apparatus, and may be able to achieve a good touch effect and support multi-touch operation. Furthermore, the first touch electrodes 51 and the second touch electrodes 52 made of metal materials may be able to prevent an ESD (Electrostatic Discharge).

For example, the plurality of first touch sub-electrodes 511 and the plurality of rows of second touch sub-electrodes 521 may be both in a planar structure, and the materials of the plurality of first touch sub-electrodes 511 and the plurality of rows of second touch sub-electrodes 521 are all indium tin oxide (ITO).

By using a light-transmitting material to form the plurality of first touch sub-electrodes 511 and the plurality of rows of second touch sub-electrodes 521, it may be possible to simplify structures of the plurality of first touch sub-electrodes 511 and the plurality of rows of second touch sub-electrodes 521 while ensuring a high light transmittance of the touch structure 5. In this way, the manufacturing process of the display substrate 100 may be simplified, and the production efficiency of the display substrate 100 may be improved.

In some other embodiments, as shown in FIGS. 17 and 19, the first part 50 of the touch structure 5 includes a plurality of second touch electrodes 52 that are spaced apart and extend along the second direction Y. The touch structure 5 further includes: a second insulating layer 8 provided on sides of the plurality of second touch electrodes 52 away from the base 1, and a plurality of first touch electrodes 51 that are spaced apart and extend along the first direction X provided on a side of the second insulating layer 8 away from the base 1. The first direction X intersects the second direction Y.

As shown in FIG. 18, in the touch structure 5, the plurality of second touch electrodes 52, the second insulating layer 8, and the plurality of first touch electrodes 51 are stacked successively on the surface of the encapsulating layer 3 away from the base 1. The plurality of second touch electrodes 52 are in direct contact with the surface of the encapsulating layer 3 away from the base 1, and the second insulating layer 8 insulates the plurality of first touch electrodes 51 and the plurality of second touch electrodes 52 from each other.

The material of the second insulating layer 8 may be of various types. For example, the material of the second insulating layer 8 may be an organic resin material (such as acrylic glue). Or, the material of the second insulating layer 8 may be an inorganic material (such as silicon nitride).

The structures of the plurality of first touch electrodes 51 and the plurality of second touch electrodes 52 may be of various types, and are related to their respective materials.

For example, the plurality of first touch electrodes 51 and the plurality of second touch electrodes 52 are both in a grid structure, and the materials of the plurality of first touch electrodes 51 and the plurality of second touch electrodes 52 are all metal oxide materials.

The shape of the grid in the grid structure may be a regular polygon or an irregular polygon, and the shape of the grid can be selected according to actual needs. Taking a first touch sub-electrode 51 in FIG. 19 as an example, a plurality of metal wires cross each other to form a plurality of diamond-shaped grids. As for the display structure 100 applied to a display apparatus of any size, a relevant software may be used to perform an optical simulation before fabricating the plurality of first touch electrodes 51 and the plurality of second touch electrodes 52 of the grid structure, so that the parameters of the plurality of first touch electrodes 51 and the plurality of second touch electrodes 52 match the display structure 100. For example, as for a diamond-shaped grid, an appropriate diamond grid side length and an appropriate included angle can be obtained through a simulation. In this way, it may be possible to avoid interference fringes on the display apparatus after the display substrate 100 is applied to the display apparatus due to a mismatch between the grid structure and the display substrate 100.

In addition, in the case where the plurality of first touch electrodes 51 and the plurality of second touch electrodes 52 are both in a grid structure and their materials are all metal oxide materials, it may be possible to ensure that the touch structure 5 not only has a high light transmittance, but also has a low resistance and a high conductivity. In this way, it may be possible to avoid the transmission delay of the electric signal in the touch structure 5, and thus improve the sensitivity and the touch effect of the touch structure 5.

For example, as shown in FIG. 17, the plurality of first touch electrodes 51 and the plurality of second touch electrodes 52 may both be in a planar structure, and the materials of the plurality of first touch electrodes 51 and the plurality of second touch electrodes 52 are all indium tin oxide (ITO).

By using a light-transmitting material to form the plurality of first touch electrodes 51 and the plurality of second touch electrodes 52, it may be possible to simplify the structures of the plurality of first touch electrodes 51 and the plurality of second touch electrodes 52 while ensuring that touch structure 5 has a high light transmittance. In this way, the manufacturing process of the display substrate 100 may be simplified, and the production efficiency of display substrate 100 may be improved.

In some embodiments, as shown in FIG. 22, the display substrate 100 further includes a protective layer 9 provided on a side of the touch structure 5 away from the base 1. The protective layer 9 covers the touch structure 5 and is used to protect the touch structure 5.

For example, a material of the protective layer 9 may be an inorganic material.

In some embodiments, as shown in FIGS. 14 and 17, the display substrate 100 further includes a plurality of signal lines L electrically connected with the touch structure 5. The plurality of signal lines L extend to the binding area 4.

In some examples, a plurality of welding points are provided in the binding area 4. The plurality of signal lines L extend to the binding area 4. That is, the plurality of signal lines L are electrically connected with the plurality of welding points in the binding area 4 respectively.

In some other examples, the touch structure 5 includes a plurality of first electrodes 51 and a plurality of second electrodes 52. The plurality of signal lines L are electrically connected with the touch structure 5. That is, the plurality of signal lines L are electrically connected with the plurality of first electrodes 51 respectively, and are electrically connected with the plurality of second electrodes 52 respectively.

It will be noted that the binding area 4 is used for binding the IC (Integrated Circuit) and/or FPC (Flexible Printed Circuit). The bonded IC and/or FPC can provide electrical signals to the plurality of signal lines L extending to the binding area 4 to transmit the electrical signals to the touch structure 5.

In addition, as for all the drawings relating to the binding area 4 in the present disclosure, an illustration is given by taking an example in which the signal lines L electrically connected with the touch structure 5 extend to the binding area 4 and the number of the binding area 4 is one, but the present disclosure is not limited thereto.

In some embodiments, the material of the plurality of signal lines L is the same as the material of the first part 50 of the touch structure 5, and the plurality of signal lines L are disposed in the same layer as the first part 50. In this way, the manufacturing process of the display substrate 100 may be simplified.

Herein, the plurality of first touch electrodes 51 and the plurality of second touch electrodes 52 in the touch structure 5 are electrically connected with the plurality of signal lines L through vias, respectively.

Figure 23:
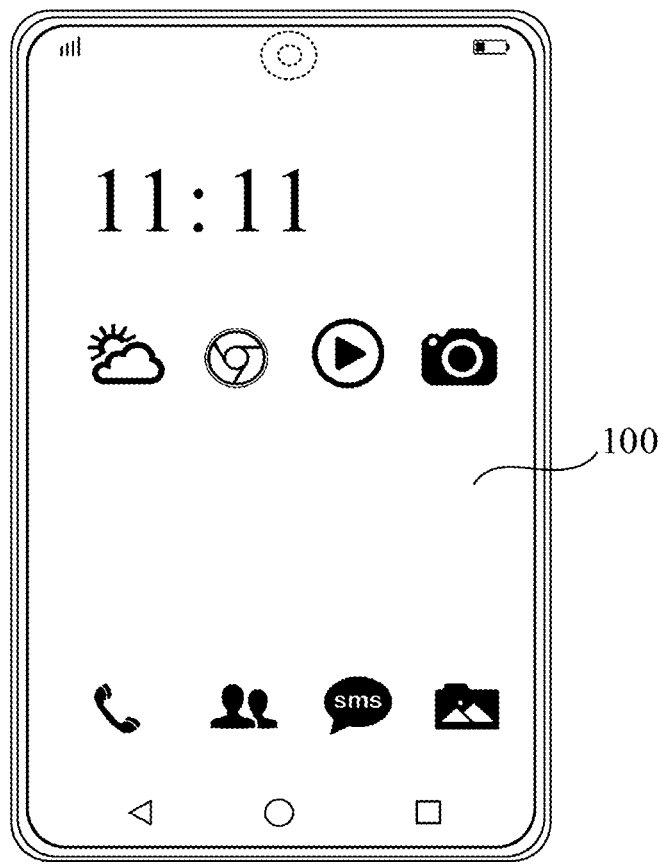
FIG. 23 is a structural diagram of a display apparatus, according to some embodiments of the present disclosure.

Some embodiments of the present disclosure further provide a display apparatus 200. As shown in FIG. 23, the display apparatus 200 includes the display substrate 100 as provided in some of the above embodiments.

The display substrate 100 included in the display apparatus 200 has the same structure and beneficial effects as the display substrate 100 provided in some of the above embodiments, which will not be described herein again.

In some examples, the display apparatus 200 further includes: a case for housing the display substrate 100, and/or a camera mounted on the display substrate 100.

In some embodiments, the display apparatus 200 is any product or component having a display function, such as an electronic paper, a mobile phone, a tablet computer, a television, a display, a notebook computer, a digital photo frame, and a navigator.

The forgoing descriptions are merely specific implementations of the present disclosure, but the protection scope of the present disclosure is not limited thereto. Any person skilled in the art could conceive of changes or replacements within the technical scope of the present disclosure, which shall all be included in the protection scope of the present disclosure. Therefore, the protection scope of the present disclosure shall be subject to the protection scope of the claims.

What is claimed is:

1. A method for manufacturing a display substrate, comprising:
providing a base, the base having a non-display area that includes a binding area;
forming a light-emitting functional layer and an encapsulating layer successively on a side of the base, an orthographic projection of the encapsulating layer on the base not overlapping with the binding area; and
forming a touch structure on a surface of the encapsulating layer away from the base, the touch structure including a first part that is in contact with the encapsulating layer, and a material of the first part including a conductive material,
wherein forming the first part includes forming the first part by a nanoimprint process, and
wherein the forming the first part by the nanoimprint process includes:
providing a transfer printing template substrate;
forming an imprint adhesive layer on a side of the transfer printing template substrate to obtain a transfer printing template, the imprint adhesive layer including a plurality of grooves that are spaced apart;
filling the plurality of grooves with a conductive material; and
imprinting the transfer printing template filled with the conductive material on the surface of the encapsulating layer away from the base to obtain the first part.

2. The method according to claim 1, wherein
forming the touch structure on the surface of the encapsulating layer away from the base includes:
forming a plurality of metal bridges that are spaced apart on the surface of the encapsulating layer away from the base, the plurality of metal bridges that are spaced apart being the first part of the touch structure;
forming a plurality of first touch electrodes extending along a first direction on sides of the plurality of metal bridges away from the base, each first touch electrode including a plurality of first touch sub-electrodes connected in series along the first direction; and
forming a plurality of rows of second touch sub-electrodes in a same layer as the plurality of first touch electrodes, each row of second touch sub-electrodes including a plurality of second touch sub-electrodes that are spaced apart along a second direction, and every two adjacent second touch sub-electrodes in each row of second touch sub-electrodes being electrically connected with a single metal bridge through a via, so that the plurality of rows of second touch sub-electrodes and the plurality of metal bridges form the plurality of second touch electrodes;
wherein the first direction intersects the second direction.

3. The method according to claim 2, further comprising:
after forming the plurality of metal bridges, and before forming the plurality of first touch electrodes and the plurality of rows of second touch sub-electrodes in the same layer, forming a first insulating film on sides of the plurality of metal bridges away from the base; and
patterning the first insulating film to form a plurality of vias exposing the plurality of metal bridges in the first insulating film.

4. The method according to claim 2, wherein the plurality of first touch sub-electrodes and the plurality of rows of second touch sub-electrodes are both in a grid structure, and materials of the plurality of first touch sub-electrodes and the plurality of rows of second touch sub-electrodes are all metal materials.

5. The method according to claim 1, wherein
forming the touch structure on the surface of encapsulating layer away from the base includes:
forming a plurality of second touch electrodes that are spaced apart and extend along a second direction on the surface of the encapsulating layer away from the base, the plurality of second touch electrodes being the first part of the touch structure;
forming a second insulating layer on sides of the plurality of second touch electrodes away from the base; and
forming a plurality of first touch electrodes that are spaced apart and extend along a first direction on a side of the second insulating layer away from the base;
wherein the first direction intersects the second direction.

6. The method according to claim 5, wherein forming the plurality of first touch electrodes includes: forming the plurality of first touch electrodes by a nanoimprint process.

7. The method according to claim 5, wherein the plurality of first touch electrodes and the plurality of second touch electrodes are both in a grid structure, and materials of the plurality of first touch electrodes and the plurality of second touch electrodes are all metal oxide materials.

8. The method according to claim 1, wherein forming the light-emitting functional layer on the side of the base includes:
forming an anode layer on the side of the base;
forming a light-emitting layer on a side of the anode layer away from the base; and
forming a cathode layer on a side of the light-emitting layer away from the base.

9. The display substrate method according to claim 1, further comprising:
forming a protective layer provided on a side of the touch structure away from the base.

10. The method according to claim 1, further comprising:
forming a plurality of signal lines electrically connected with the touch structure, the plurality of signal lines extending to the binding area.

11. The method according to claim 10, wherein the plurality of signal lines and the first part of the touch structure are of a same material, and the plurality of signal lines and the first part are disposed in a same layer.

* * * * *